(12) United States Patent
Jones

(10) Patent No.: US 6,813,753 B2
(45) Date of Patent: Nov. 2, 2004

(54) METHOD OF DETERMINING LIBRARY PARAMETERS USING TIMING SURFACE PLANARITY

(75) Inventor: Anthony Mark Jones, Beaverton, OR (US)

(73) Assignee: Micron Technology, Inc., Boise, ID (US)

(*) Notice: Subject to any disclaimer, the term of this patent is extended or adjusted under 35 U.S.C. 154(b) by 48 days.

(21) Appl. No.: 10/124,021

(22) Filed: Apr. 16, 2002

(65) Prior Publication Data

US 2003/0200517 A1 Oct. 23, 2003

(Under 37 CFR 1.47)

(51) Int. Cl.[7] .............................................. G06F 17/50
(52) U.S. Cl. ..................................... 716/6; 716/1; 716/2
(58) Field of Search ............................... 716/1, 2, 6, 4, 716/5, 12

(56) References Cited

U.S. PATENT DOCUMENTS

| | | |
|---|---|---|
| 4,924,430 A | 5/1990 | Zasio et al. |
| 5,475,605 A | 12/1995 | Lin |
| 5,654,898 A | 8/1997 | Roetcisoender et al. |
| 6,023,567 A | 2/2000 | Osler et al. |
| 6,028,995 A * | 2/2000 | Jetton et al. .................... 716/6 |
| 6,272,668 B1 | 8/2001 | Teene |
| 6,301,693 B1 | 10/2001 | Naylor et al. |
| 6,701,497 B1 * | 3/2004 | Ohkubo .......................... 716/6 |

* cited by examiner

Primary Examiner—Thuan Do
(74) Attorney, Agent, or Firm—Thorp Reed & Armstrong, LLP

(57) ABSTRACT

The present invention relates to a method for pre-characterizing a timing delay curve of a first current component, wherein the timing delay curve has a first curvilinear region and a second, linear method includes determining a first delay equation representing the first, curvilinear region of the delay curve, determining a second delay equation representing the second, linear region of the delay curve, and determining a corner capacitance representing a transition point from the first, curvilinear region to the second, linear region. The present invention further relates to a method of determining a scaling factor and applying the scaling factor to a pre-characterized base component to characterize the timing delay curve of additional circuit components.

17 Claims, 14 Drawing Sheets

↑ Delay
↙ Load    ↘ Ramp Time

METHOD OF DETERMINING LIBRARY PARAMETERS USING TIMING SURFACE PLANARITY

FIELD OF THE INVENTION

The present invention relates generally to the field of integrated circuit design and more particularly relates to determining the characteristics of an integrated circuit component.

BACKGROUND

Designers utilize computer aided engineering (CAE) systems when creating integrated circuits. CAE systems, in general, permit a designer to electronically construct and test a model circuit, without having to physically assemble the test circuit. The designer selects the type of component (also referred to as cells, devices, etc.) from a system library. The designer then places and connects the component with other components within the model circuit. The designer may then execute tests that simulate the operational characteristics of the model circuit The designer may change the type of components used, the placement of the components, and the interconnection routing of the circuit in an attempt to optimize the operational characteristics of the integrated circuit. Thus, by using CAE, the designer may insure that the design criteria for the integrated circuit is met before the integrated circuit is physically manufactured.

The CAE's system library contains a list of components that may be selected by the designer. The library may contain a multitude of component types, for example, the library may contain inverters, transistors, multiplexers, latches, and flip-flops, among others. The library may also contain each component's characteristics or parameter information, for example, the operating voltage, resistance, capacitance, threshold voltage, and timing delay, among others. Additionally, the library may contain several components of a single type, each having different parameters. For example, the library may contain several inverters, each having a different timing delay characteristic, among others Thus, a designer may choose from the library and substitute a component having different parameters to optimize the integrated circuit. The library may be updated by adding new components or changing the parameters of existing components.

One challenge related to creating or updating the library is determining the characteristics for a specific component. Prior art methods for determining a component's characteristics are very time consuming. In particular, prior art methods for determining the timing delay characteristics of a component use time-intensive iterative approaches. Furthermore, the iterative approaches must be completed for each component m the library because adequate scaling methods do not exist. For example, the delay curve of a component is usually non-linear due to the component's dependence on the edge ramp time of an input signal and the capacitive load. Because prior art scaling methods for overcoming the non-linearity of the delay curve do not exist an iterative process must be used to characterize the timing delay of each component for various input edge ramp times and capacitive loads.

A need exists, therefore, for a method that simplifies the determination of a component's characteristics. In particular, a need exists for a method of characterizing a component having a reduced number of iterative steps. Additionally, a need exists for a method for determining the characteristics of components by scaling a pre-characterized component, without using an iterative process on each component.

SUMMARY

One embodiment of the present invention relates to a method for characterizing a timing delay curve of a circuit component, wherein the timing delay curve has a first region and a second region. The method includes determining a first delay equation representing the first region of the delay curve, determining a second delay equation representing the second region of the delay curve, and determining a corner capacitance representing a transition point from the first region to the second region.

Another embodiment of the present invention relates to a method for characterizing a timing delay curve for each of a plurality of circuit components. The method includes pre-characterizing the timing delay curve of a first circuit component, and scaling the pre-characterized timing delay curve of the first circuit component to obtain a characterized timing delay curve for another circuit component. The timing delay curve of a first circuit component step may be pre-characterized by determining a corner capacitance for the first circuit component, and determining the gradient of the second region of the first circuit component's delay curve.

Yet another embodiment of the present invention relates to a method for characterizing a plurality of components within a computer aided engineering system library. The method includes pre-characterizing a base component, determining a scaling factor, and scaling the pre-characterized base component to characterize another of the plurality of components. Pre-characterizing the base component may include determining a corner capacitance representing a transition point between a first region and a second region of a delay curve for the base component, and determining the shape of the first region and the second region of the delay curve of the base component. Determining the scaling factor may include determining the gradients for the second region of the delay curves the base component and for another component.

An embodiment of the present invention relates to a circuit for modeling the characteristics of a component. The circuit includes a resistance for modeling an output transistor of the component, a capacitance for modeling the output load of the component, a switch operable to connect the resistance to the capacitance, and an input signal generator providing an input signal to the circuit. The resistance of the model circuit may be variable with respect to the input signal and to time.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

An embodiment of the present invention relates to a method for determining, or characterizing, a timing delay curve for a circuit component. Another embodiment of the present invention relates to a method for pre-characterize a base component, determining a scaling factor, and using the pre-characterized base component and a scaling factor to characterize a multitude of components. The embodiments of the present invention eliminate the use of complex iterative processes to characterize each component.

A graph of delay versus capacitive load yields two distinct regions for the delay equation, a curvilinear region and a linear region. In one embodiment, the transition point between the two regions, called the corner capacitance, is determined for a first component. The corner capacitance is inversely proportional to the slope of the linear region of the delay equation and proportional to the input ramp time of an input signal applied to the component. According to one embodiment, the corner capacitance can be used to determine a scaling factor for characterizing other components.

Figure 1:
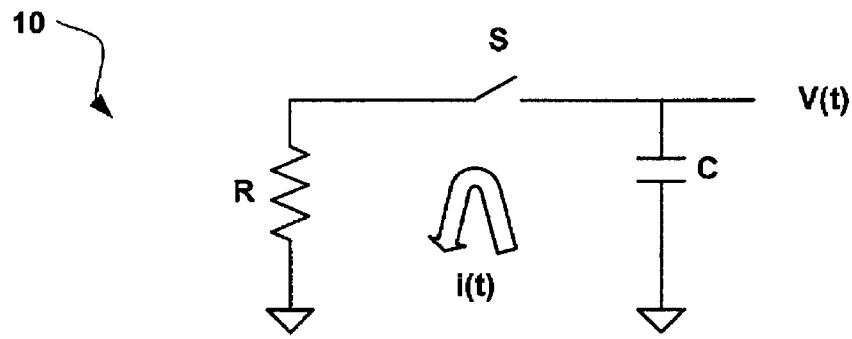
FIG. 1 illustrates a circuit model used to mimic the delay characteristics of a logic gate within a component according to one embodiment of the present invention
Figure 2:
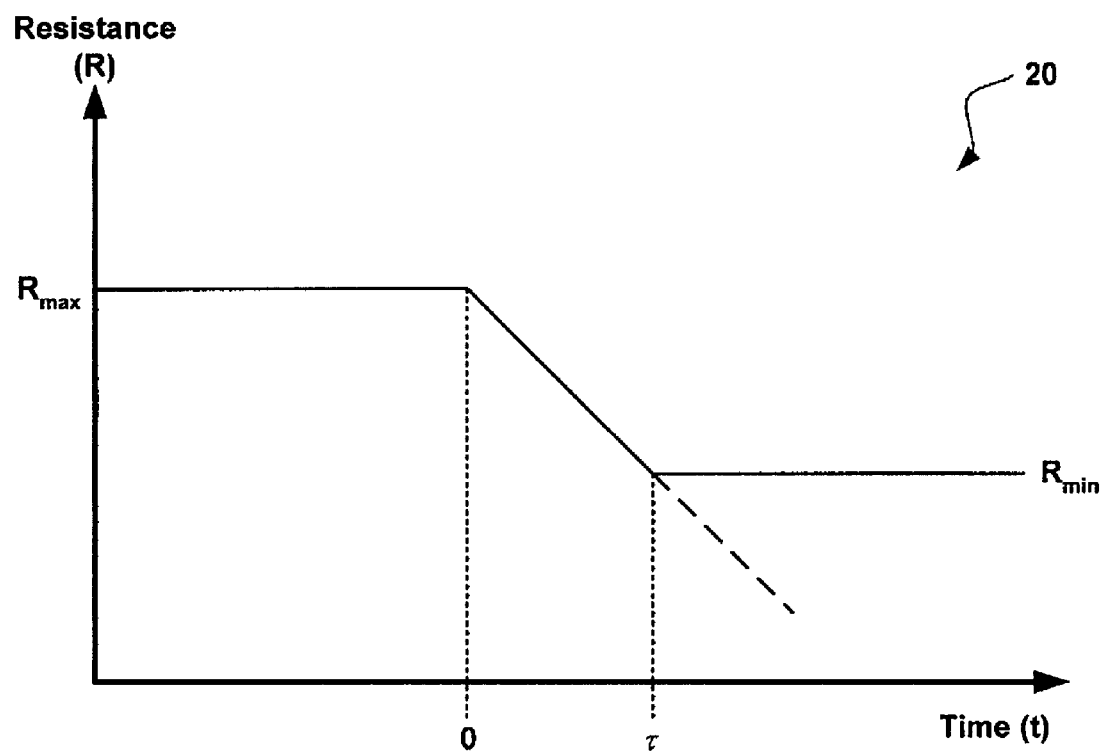
FIG. 2 illustrates the amount of resistance present in the circuit model shown in FIG. 1 versus time relative to a change in an input signal in accordance with one embodiment of the present invention.

FIG. 1 illustrates a circuit model 10 for mimicking the delay of a logic gate, such as a transistor among others, within a component (for example, an inverter, flip-flop, etc) according to one embodiment of the present invention. Delay refers to the time it takes for a signal to propagate from the input to the output of the logic gate or component. The model 10 contains a resistor R, representing the resistance of the component's output transistor, a capacitor C, representing the component's output load, and an ideal switch S. The resistor R is assumed to vary with time relative to an input signal V(t). In the current embodiment, capacitive coupling and small-signal gain from the input signal V(t) is ignored FIG. 2 is a graph 20 of the amount of resistance present in the model 10 versus time, relative to a change in the input signal V(t) in accordance with one embodiment of the present invention. In the current embodiment, the input signal V(t) is applied to resistor R, after capacitance C is charged, and current i(t) flows within the circuit, when the switch S is closed. As shown in graph 20, for times $t \leq 0$, switch S is open, and with the capacitance C charged, the resistance of the model is constant having a value Rmax. Likewise, for times $t \geq \tau$, switch S is closed, a steady condition is achieved, the resistance of the model is constant having a value Rmin. For simplicity, a constant fraction, f, is introduced such that $Rmin = f \cdot Rmax$, for $0 < f < 1$ and where zero indicates an infinite change in resistance.

After switch S is closed (i.e., at t=0), the value of resistor R linearly decreases from Rmax until reaching Rmin at t=τ. The decrease in resistance can be represented by the following equation for $0 < t < \tau$:

$$R(t) = R_{\max} - \frac{(R_{\max} - R_{\min})}{\tau} t \tag{1}$$

Substituting f·R for Rmin and R for Rmax, this equation becomes:

$$R(t) = R\left[1 - (1-f)\frac{t}{\tau}\right] \tag{2}$$

As previously stated, Equation (2) holds true where 0<f<1, the real mathematical function is shown as the continuing dotted line 24 in FIG. 2.

In the current embodiment, effects such as threshold voltage are assumed to be zero. In an alternative embodiment, non-zero effects can be included by offsetting the resistance values and the time at which the zero point is determined.

In the current embodiment, graph 20 is divided into two regions and various equations are solved for each region. Region 1 corresponds to the sloped portion of the graph 20 where 0<t<τ. Region 1 can be represented by the following equation:

$$i(t) = -\frac{V(t)}{R(t)} = C\frac{dV}{dt} \tag{3}$$

Equation 3 becomes:

$$\Rightarrow CR\left[1 - \frac{1-f}{\tau}t\right]\frac{dV}{dt} + V(t) = 0 \tag{4}$$

Solving equation 4 for V(t) provides:

$$V(t) = C_o \frac{RC}{\tau}[\tau - (1-f)t]^{\frac{\tau}{(1-f)RC}} \quad (5)$$

For V(0)=Vdd, $C_o$ becomes $$C_o = \frac{Vdd}{RC}.$$

The delay (ignoring the effect of threshold which will be accounted for later) is then given by the equation:

$$V(0) - V(d) = \frac{Vdd}{2} \quad (6)$$

Substituting and solving equation 5 the delay, d, is found as:

$$d = \frac{\tau}{1-f}[1 - 2^{-(1-f)RC/\tau}] \quad (7)$$

As previously stated, equation 7 represents the portion of the graph 20 where $0<t<\tau$.

Referring again to FIG. 2, region 2 corresponds to the portion of graph 20 where $t>>\tau$ and where R=Rmin. Region 2 can be represented by the following equation:

$$\tau(t) = -\frac{V(t)}{R_{min}} = C\frac{dV}{dt} \quad (8)$$

Substituting f R for Rmin and Vdd/RC for $C_o$, the following equation can be obtained:

$$V(t) = Vdd\left[1 - \exp\left(-\frac{t}{fRC}\right)\right] \quad (9)$$

Using Equation 9, the following equation is derived for the delay, d, within region 2:

$$d = fRC\ln2 \quad (10)$$

Figure 3:
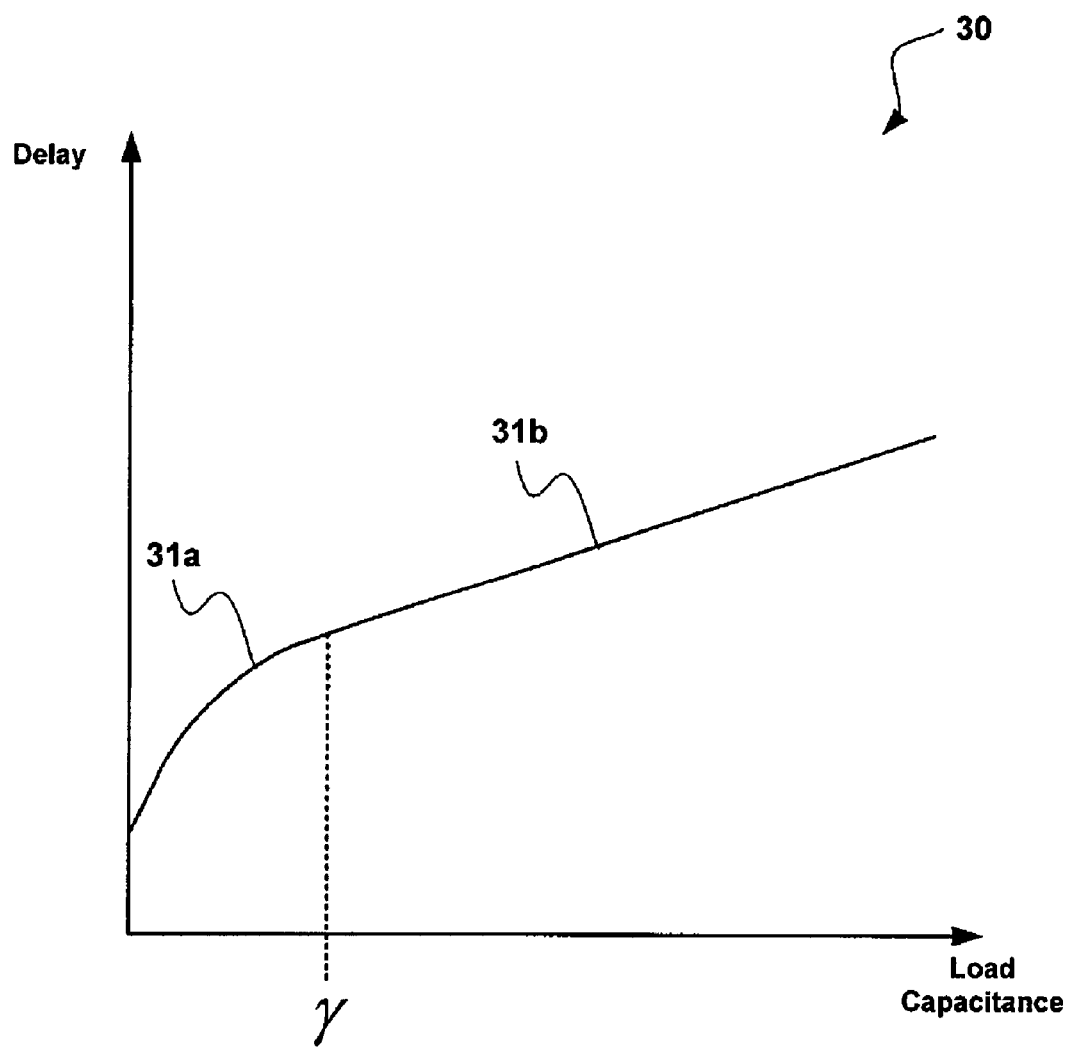
FIG. 3 is a graphical representation of a component's delay curve having a curvilinear region and a linear region according to an embodiment of the present invention.

FIG. 3 is a graph 30 of delay versus load capacitance for the component modeled in FIG. 1. The graph 30 is obtained using the two delay equations (i.e., Equation 7 and Equation 10) according to an embodiment of the present invention. Referring to FIG. 3, equation 7 produces a curvilinear region 31a and equation 10 produces a linear region 31b. The transition point between the two regions is denoted as γ, and is referred to as the corner capacitance. For delays within the same timing range as the input edge time of the input signal applied to the component, the curvilinear region 31a is predicted. For delays much longer than the input edge time, a linear region 31b is predicted.

Figure 4:
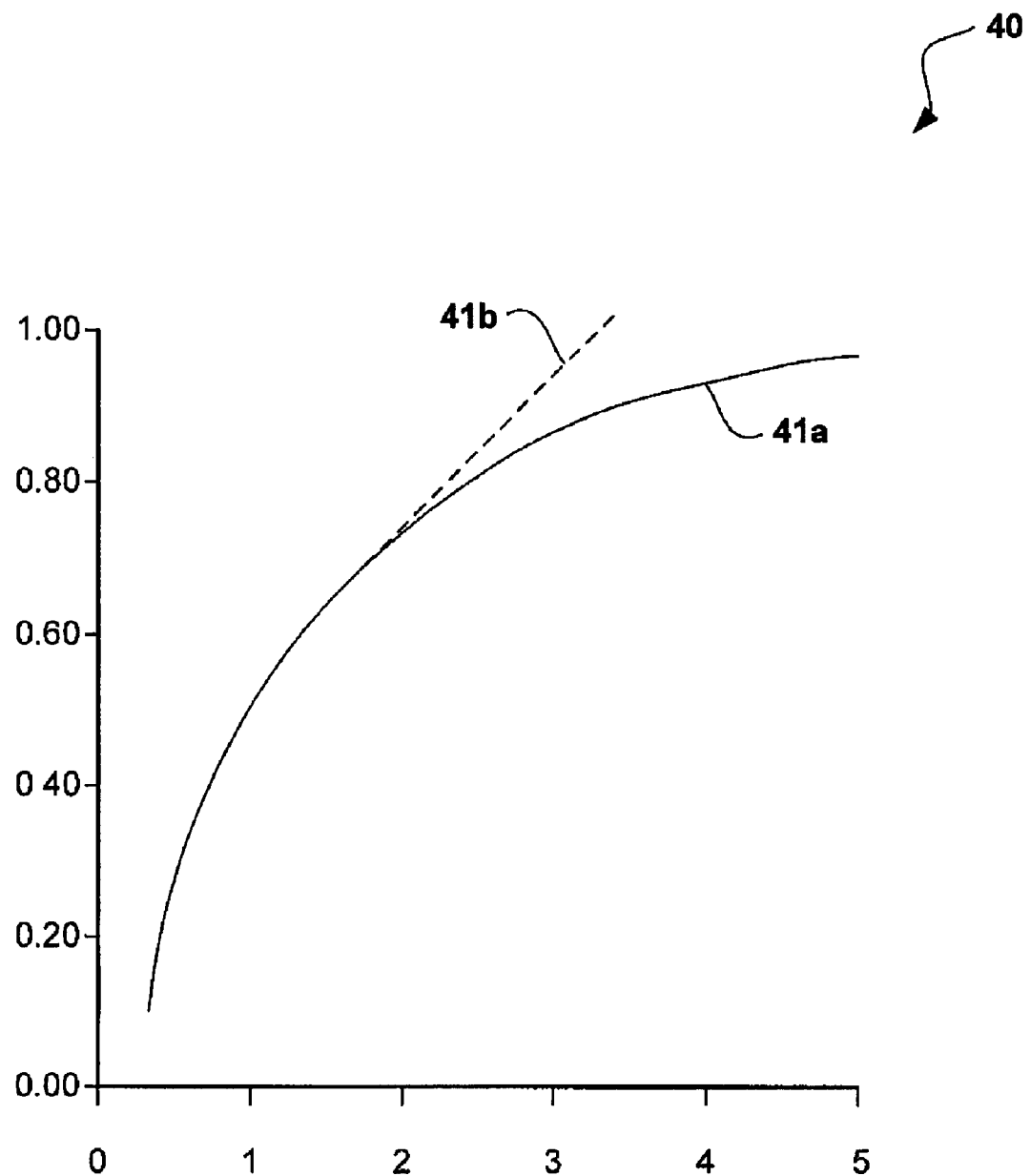
FIG. 4 is a normalized plot of an equation used to determine a portion of the delay curve shown in FIG. 3 according to an embodiment of the present invention.

FIG. 4 is a normalized plot 40 of equation 7 and equation 10. As can be seen in FIG. 4, equation 7 produces a curvilinear plot 41a. Specifically, the region between 0 and 2 represents the condition where the input function is properly defined. Further examination of the shape of the normalized plot of equation 7 leads to the expansion of the function:

$$2^x = e^{x\ln2} \cong 1 + x\ln2 + \frac{(x\ln2)^2}{2} \quad (11)$$

Substituting equation 11 into equation 7, the following delay equation can be derived:

$$\Rightarrow d \cong RC\ln2\left[1 - \frac{(1-f)RC\ln2}{2\tau}\right] \quad (12)$$

Examination of equation 12 shows that for small output capacitance C, the normalized plot is basically linear. Furthermore, for an output capacitance C where the normalized x is less than 1.44, a quadratic function is produced.

The extended dotted line 41b illustrates equation 10 normalized and shifted to allow for threshold effects. The gradient of dotted line 41b is given by:

$$\frac{\partial d}{\partial C} = fR\ln2 \quad (13)$$

As previously discussed, the scaling method of the present invention states that two distinct regions exist for the delay equation, the curvilinear region and the linear region. The transition point between the two regions, denoted as γ, is called the corner capacitance. Thus, where the two regions meet, equations 12 and 13 are approximately equal to each other, and therefore, γ can be substituted for C to obtain:

$$fR\gamma\ln2 \approx R\gamma\ln2\left[1 - \frac{(1-f)R\gamma\ln2}{2\tau}\right] \quad (14)$$

Solving for γ, the following equation can be derived:

$$\gamma = \frac{2\tau}{R\ln2} \quad (15)$$

From equation 15:

$$\gamma \propto \tau \quad (16)$$

and, $$\gamma\frac{\partial d}{\partial C} = \text{constant} \quad (17)$$

Equations 16 and 17 form the mathematical foundation for the scaling method of an embodiment of the present invention. As can be seen from equation 17, the corner capacitance is inversely proportional to the slope in the linear region. Furthermore, equation 16 illustrates that the corner capacitance is proportional to the input edge ramp time.

To examine the validity of the present invention's scaling method analysis, in terms of keeping the delay d within the input edge ramp time $\tau_r$, equation 7 can be re-written as:

$$d = \frac{\tau}{(1-f)}\left[1 - \frac{1}{2^{(1-f)\xi}}\right] \text{ where} \quad (18)$$

$$\xi = \frac{RC}{\tau} \text{ and } \xi\bigg|_{C=\gamma} = \frac{R\gamma}{\tau} = \frac{2}{\ln2}.$$

Using equation 18, a table illustrating delay versus f can be determined. For example, Table 1 shown below, illustrates delay versus f for the corner capacitance when $\xi$ is set equal to 2.88:

TABLE 1 f versus d (for corner point where $\xi \approx 2.88$)

| (f) | Delay (d) |
|---|---|
| 0 | 0.86τ |
| ⅛ | 0.94τ |
| ¼ | 1.03τ |
| ½ | 1.26τ |
| ¾ | 1.57τ |
| ⅞ | 1.77τ |
| →1 | 2.00τ |

As evident in Table 1, the input ramp time, τ, is a significant fraction of the delay at the corner capacitance, particularly for a large change in resistance (i.e., when f is small). Thus, the analysis remains in or near the region where the equations are well defined and therefore, the placement of the corner capacitance where the two equations intersect can be justified.

The scaling method of the present invention can easily be extended to include threshold, parasitic capacitance and resistance effects. These effects will be separately addressed.

Figure 5:
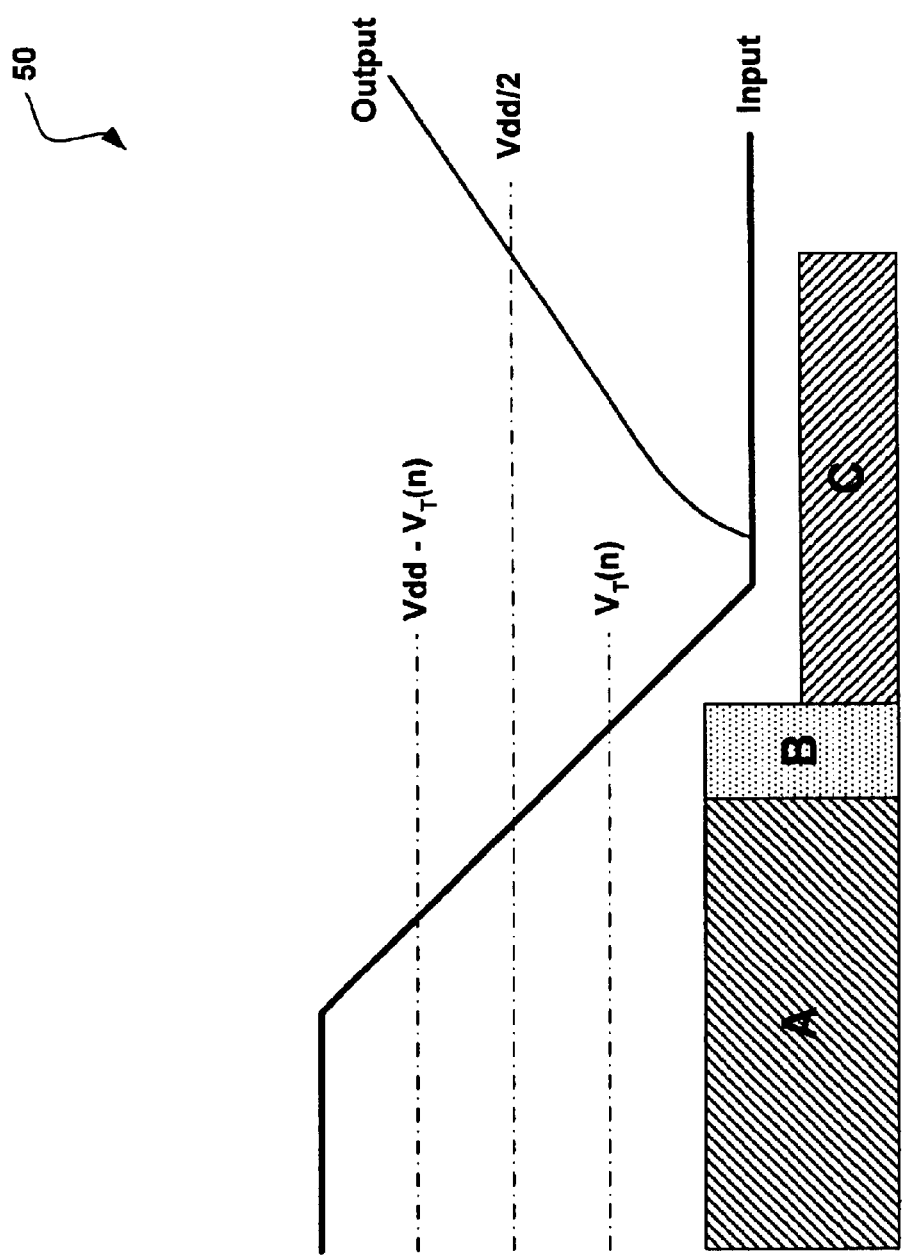
FIG. 5 illustrates the result of threshold effects on the delay measurements of a component in accordance with an embodiment of the present invention.

Threshold effects, although very difficult to calculate, can be approximated using an embodiment of the present invention. FIG. 5 illustrates the result of threshold effects on the delay measurements of a component in accordance with an embodiment of the present invention. Input and output waveforms applied to a component, such as a CMOS inverter for example having a p-type portion and n-type portion, are shown in FIG. 5. As illustrated, the CMOS inverter has its input driven from a high voltage to a low voltage. Three areas, A, B, and C deserve attention when examining threshold effects.

Area A represents an operating state in which the n-type portion of the inverter is predominantly active and the p-type portion is predominantly inactive Area A is of little interest for threshold purposes because no delay is present (i.e., d=0). Area B represents a state in which both the n-type and p-type portions of the inverter are active. In the current embodiment, it is assumed, for approximation purposes, that all of the current is shunted past the output load. Area C represents a state in which the p-type portion is predominantly active and the n-type portion is predominantly inactive.

In the current embodiment, it is assumed that the inverter's output evolves according to equations 7 and 10 discussed above. Thus, the measured delay, from mid-rail to mud-rail consists of two components, the first from area B and the second from area C. If the input ramp time is denoted by $\tau_r$, the measured delay can be presented as:

$$d_{measured} = \frac{V_{dd} - 2V_T(n)}{2V_{dd}}\tau + \delta(f, R, C, \tau) \quad (19)$$

where the function δ denotes the delay equations given by equations 7 and 10.

A parasitic capacitance is also associated with each component. In general, parasitic capacitance leads to a non-zero delay, known as the intrinsic delay of the component (even with zero load capacitance) In the current embodiment, a positive intrinsic delay, one that differs from the intrinsic delay found using an equivalent linear model, can be found. The intrinsic delay is of interest when examining the coupling from the input edge with small load capacitance. In the current embodiment, a sample model is used which lumps all of the parasitic capacitance into an equivalent intrinsic capacitance, $C_1$. The load capacitance is then simply the sum of $C_1$ and C. By substituting C and $C_1$ into equation 7, the following equation can be derived:

$$d = \frac{\tau}{1-f}[1 - 2^{-(1-f)R(C+C_1)/\tau}] \quad (20)$$

which, for a fixed edge ramp, has the form $$d = \alpha\left[1 - \frac{1}{\beta 2^{\lambda C}}\right] \quad (21)$$

where $$\alpha = \frac{\tau}{1-f}, \lambda = \frac{R}{\alpha}, \text{ and } \beta = 2^{\lambda C_1}$$

are constants.

Solving equation 21 for the intrinsic delay yields:

$$d|_{C=0} = \alpha\left[1 - \frac{1}{\beta}\right] \quad (22)$$

Because λ>0, it is apparent that β>1 and the intrinsic delay predicted is positive as desired. A simple substitution into equation 10 provides:

$$d|_{c-o} = fRC_1 \ln 2 \quad (23)$$

indicating the desired intrinsic delay.

Additionally, in the current embodiment, the effects of a fixed-value parasitic resistors can be determined by first denoting each parasitic resistor as $R_p$. Due to LDD, diffusion resistance, and contact resistance effects in the source and drain of the component, the real ratio of $R_{max}$ to $R_{min}$ is given by:

$$\frac{R'_{max}}{R'_{min}} = \frac{2R_p + R_{max}}{2R_p + R_{min}} \quad (24)$$

By setting $R_p = g \cdot R_{max}$, where g is some number greater than zero, and substituting into equation 24, the following equation can be derived:

$$f' = \frac{R'_{min}}{R'_{max}} = \frac{2g + f}{2g + 1} \quad (25)$$

Equation 25 indicates that a smaller absolute change in device resistance (given by 1−f) exists due to the input edge than would be expected, because:

$$f' - f = \frac{2g(1-f)}{f(2g+1)} \quad (26)$$

$$\Rightarrow f' - f > 0 \quad (27)$$

$$\Rightarrow f' > f \quad (28)$$

$$\Rightarrow 1 - f' < 1 - f \quad (29)$$

As is apparent from equation 29, as the change in resistance gets smaller, the model in the current embodiment tends to behave more as a fixed value resistor, leading to a more linear relationship between delay and load capacitance.

To compare the validity of equation 7 and equation 10, threshold effects are subtracted from the measured data. As shown above, the measured delay, when examining the linear region of the delay curve is of the form:

$$d_{measured} = \alpha \tau_r + \beta C \qquad (30)$$

where $$\alpha = \frac{V_{dd} - 2V_T(n)}{2V_{dd}},$$

and $\beta = fR \ln 2$. In the current embodiment, the edge ramp is stepped using $\tau, 2\tau, 3\tau, \ldots$ etc. to determine the value of $\alpha$. The difference between each of the measured delays (in the linear region) is then simply $\alpha\tau$. This value can be subtracted from each of the measured points to obtain the data in the raw form of equations 7 and 10. For each subsequent delay curve, integer multiples of $\alpha\tau$ can be subtracted as appropriate.

The model of the current embodiment, although simple to implement, produces an adequate approximation of the threshold effects. For example, the surfaces illustrated in FIGS. 6–8 illustrate results that are generated from theory and from measurement-corrected inverters.

Figure 6:
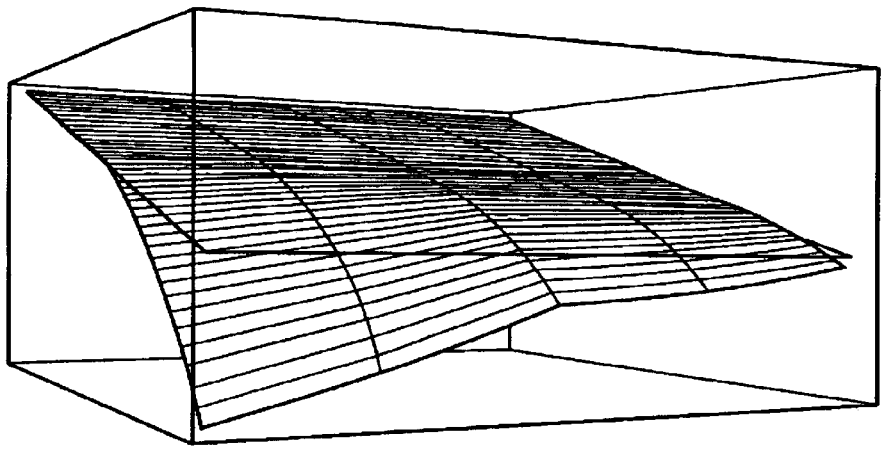
FIG. 6 illustrates a mathematical surface approximated for a component according to an embodiment of the present invention.

FIG. 6 illustrates a mathematical surface approximated for a component according to an embodiment of the present invention. The surface shown in FIG. 6 contains trends predicted by the modeling method where the theoretical basis is expanded beyond "typical" edge ramp times and capacitance loads.

Figure 7:
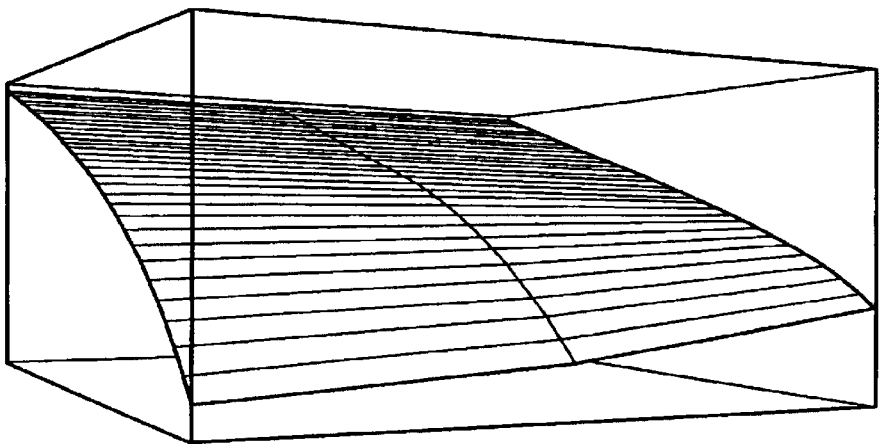
FIG. 7 illustrates the mathematical surface for the component of FIG. 6 after the application of clipping limits according to one embodiment of the present invention.

FIG. 7 illustrates the mathematical surface for the component of FIG. 6 after the application of clipping limits according to one embodiment of the present invention. FIG. 7 shows a clipped, but unscaled, region of FIG. 6, representing a more "typical" range of values used for a component.

Figure 8:
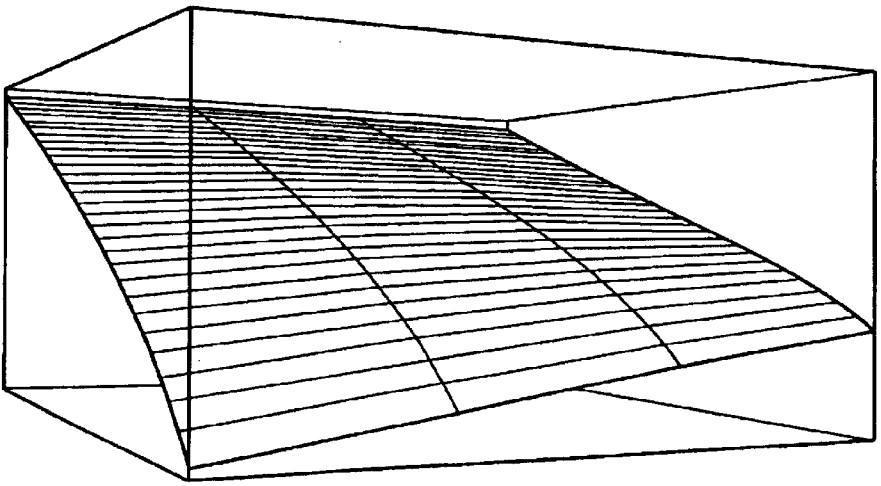
FIG. 8 illustrates the actual measured surface of the component whose mathematical surface is approximated in FIG. 6 and FIG. 7.

FIG. 8 illustrates the actual measured surface of the component whose mathematical surface is approximated in FIG. 6 and FIG. 7. FIG. 8 illustrates measured data that has been corrected for threshold effects. The match between FIG. 7 and FIG. 8 is not exact because no attempt was made to correlate and re-normalize. However, the trends between the modeled and measured data are an excellent match.

It should be noted that the results from equation 7 tend to degrade when $(1-f)RC = \kappa\tau$, where the scaling term $\kappa$ is a constant. The degeneration corresponds to a condition where the input edge tracks with the output edge. Under this condition, equation 7 degenerates into:

$$d = \frac{RC}{\kappa}\left[1 - \frac{1}{2^\kappa}\right] \qquad (31)$$

It is apparent from equation 31 that the delay degenerates into a simple linear function of C, where C represents the output load. If the threshold effects are included, the measured delay can be determined by the equation:

$$d_{measured} = \frac{V_{dd} - 2V_T(n)}{2V_{dd}} \frac{(1-f)RC}{\kappa} + \frac{RC}{\kappa}\left[1 - \frac{1}{2^\kappa}\right] \qquad (32)$$

Equation 32, through further derivation, then becomes:

$$d_{measured} = \frac{RC}{\kappa}\left[(1-f)\frac{V_{dd} - V_T(n)}{2V_{dd}} + 1 - \frac{1}{2^\kappa}\right] \qquad (33)$$

Figure 9:
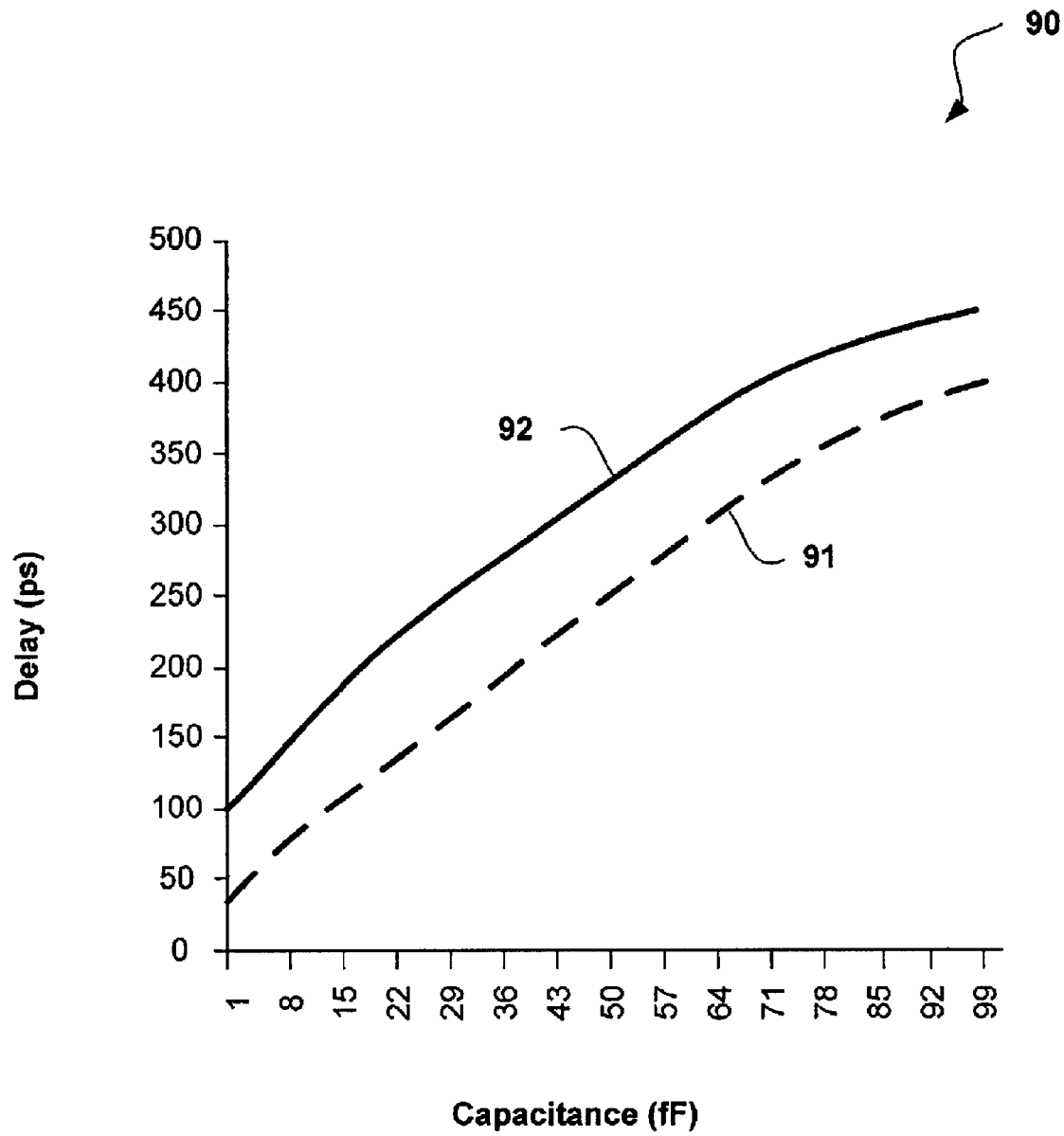
FIG. 9 illustrates a degenerate case of an approximation method of an embodiment of the present invention.

FIG. 9 illustrates a degenerate case of the approximation method of an embodiment of the present invention. A plot 90 of delay versus capacitance, illustrating the degeneration of equation 7 when the input edge tracks with the output edge, is shown in FIG. 9. The plot 90 shows the raw measured data for a fixed edge ramp 91 in relationship to the theoretical data for the degenerate case 92 obtained using equation 33. Equation 33 is a linear function of the output load, C. As seen from the plot 90, equation 33 adequately models the measured data, even at low capacitive loads. Thus, equation 33 may be used to accurately determine the intrinsic capacitance of a component.

It should be noted that quantities other than threshold effects, parasitic capacitance, and resistance effects can be determined when implementing the present invention, while remaining within the scope of the present invention. The described embodiment is in no way intended to limit the application of the present invention.

In one embodiment of the present invention, a single component is pre-characterized using an iteration process and then a scaling theory, as discussed above, is applied for all new components without repeating the iteration process The basic premise behind pre-characterization is to spend as much effort as possible iterating the characterization of a first cell (or, "base cell") according to various rules. After the base cell is pre-characterized, a scaling factor is directly applied to the pre-characterized base cell to characterize all new cells in a manner which does not require iteration.

Prior to the present invention, for example, discrete sampling methods used timing tools that required a quantized timing surface be determined and stored in a table for each cell. For accuracy, the timing samples had to be selected carefully. The selection process was technically challenging and depended on multiple criteria. Normally, an iterative algorithm was first determined and then the iterative process selected the sample points for each characterized cell. Implementing the iterative algorithm for each cell was very time consuming and inefficient.

In one embodiment of the current invention, the iterative process is used to determine sample points for a single base cell. The sample points are then scaled for each new cell using a scaling factor. For example, the ratio of the gradient (in the linear region) of the new cell to that of the gradient pre-characterized base cell is used for scaling the new cell. The use of the scaling factor eliminates the need to apply the complex algorithms for the new cell being characterized.

Determining the gradient of the linear region of a cell's delay curve is the key to any efficient pre-characterization methodology. However, there are a number of real effects that hinder measurement of the gradient, such as the shape of the input edge, threshold effects, and the simple fact that the new cell being measured is unknown, among others. In the current embodiment, one of two methods is used to determine the gradient of the linear region of a cell's delay curve, the method of comparison and the method of furthest fit. Each method will be described, as well as, how each method compensates for the real effects. It should be noted that other methods may be used while remaining within the scope of the present invention.

Figure 10:
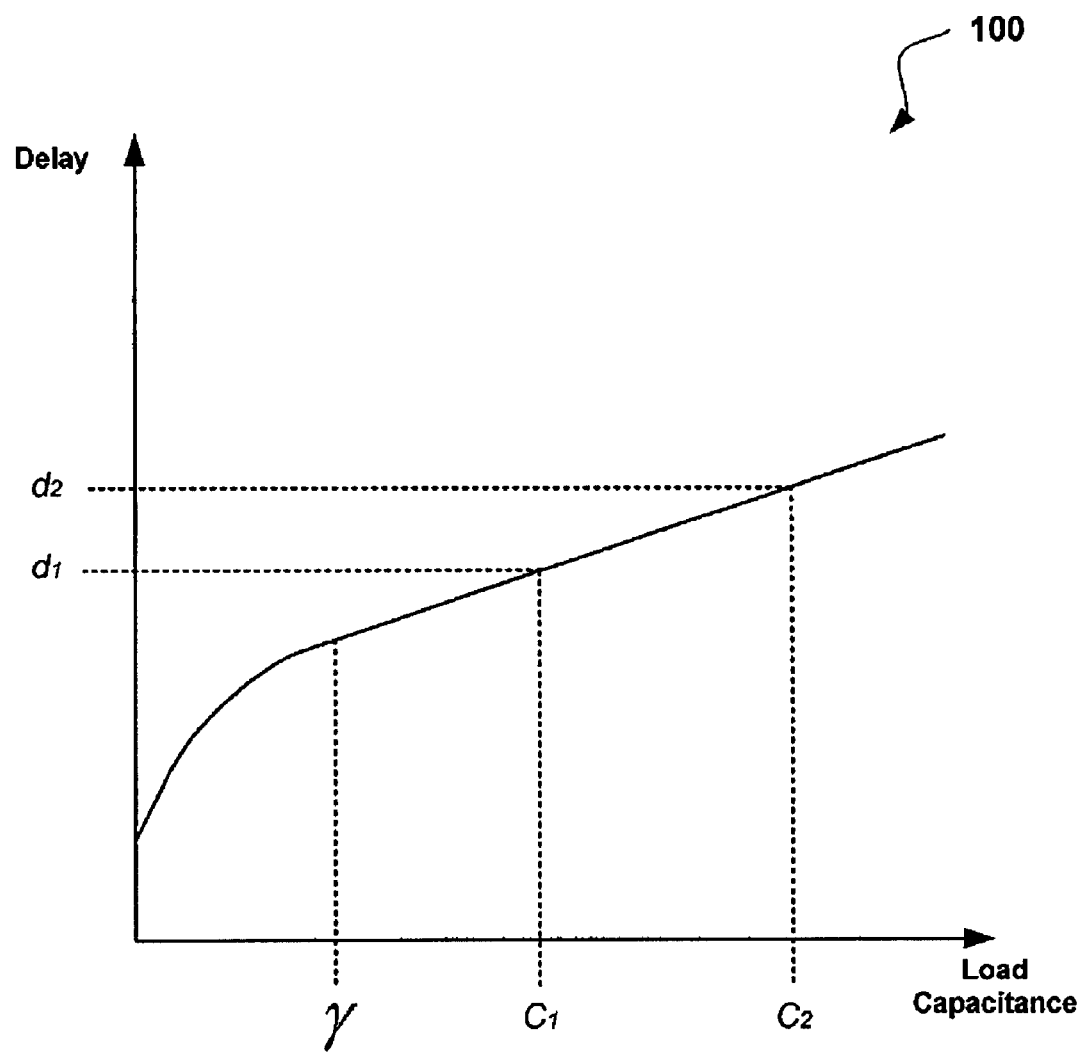
FIG. 10 illustrates a method for determining the gradient of a the linear region of a component's delay curve according to an embodiment of the present invention.

FIG. 10 illustrates a the method for determining the gradient of the linear region of a component's delay curve according to an embodiment of the present invention. In the current embodiment, a method of comparison is used for determining the gradient of the linear region. The method of comparison begins with determining two points, $C_1$ and $C_2$, both of which are greater than the corner capacitance, $\gamma$. In the current embodiment, multiples of $\gamma$, such as $2\gamma$ and $3\gamma$, are used. These points are used to determine the gradient of the base cell, using the following equation:

$$\left.\frac{\partial d}{\partial C}\right|_{base} = \frac{d_2 - d_1}{\gamma} \tag{34}$$

where $d_1$ and $d_2$ are the delays at $C_1$ and $C_2$, respectively. The delays $d_1$ and $d_2$ can be measured directly. The input edge shape used to determine the delays is also saved. Using a transistor net-list, the approximate pull-up strength of the base cell is calculated using standard methods. The approximate pull-up strength is then stored in terms of an equivalent p-transistor width, $W_{old}$.

Before characterization of the new cell begins, the new cell is examined and its equivalent pull-up strength is calculated and stored in terms of an equivalent p-transistor width, $W_{new}$. The equivalent pull-up strength of the new cell serves as a first approximation to the real scaling factor. Next, delay measurements are made for the new cell at capacitances $2\Gamma$ and $3\Gamma$, where $\Gamma$ is given by the equation:

$$\Gamma = \frac{W_{new}}{W_{old}}\gamma \tag{35}$$

It should be noted that the input edge shape stored for the base cell is used to determine the delays at $2\Gamma$ and $3\Gamma$. The gradient for the new cell is then calculated using the following equation:

$$\left.\frac{\partial d}{\partial C}\right|_{new} = \frac{d_{3\Gamma} - d_{2\Gamma}}{\Gamma} \tag{36}$$

Where $d_{3\Gamma}$ and $d_{2\Gamma}$ are the delays at $3\Gamma$ and $2\Gamma$, respectively. The scaling factor for the new cell is simply the ratio of the new gradient (found with equation 36) to the base gradient (found with equation 34).

The method of comparison assumes that by using the same input edge shape, that any shape, threshold or coupling errors are similar, and therefore, removed when the two measured delays are subtracted. This holds true for most cases, but not necessarily all cases. Important factors for using the approximate scaling factor require being able to calculate the drive strength of the new cell, and that the new scaled capacitances remain within the linear region. Each factor is easily checked post-simulation. However, by adding time and reducing efficiency, this additional check is not consistent with the concept of pre-characterization.

In an alternative embodiment, the method of furthest fit is used to determine the gradient of the cell's delay curve. In the method of furthest fit, capacitances $C_1$ and $C_2$ are chosen for the entire component library list. $C_1$ and $C_2$ are chosen such that they always remain in the linear region for any cell in the library. In this case, $C_1$ and $C_2$ are selected having relatively large values. Using the method of furthest fit, the gradient can be determined by measuring the delays $d_1$ and $d_2$ at the capacitances $C_1$ and $C_2$ respectively, for each cell. The delays and capacitances are then inserted into the following equation to determine the gradient:

$$\left.\frac{\partial d}{\partial C}\right|_{new} = \frac{d_2 - d_1}{C_2 - C_1} \tag{37}$$

Edge shape effects, threshold effects, and coupling effects can be ignored if the delays $d_1$ and $d_2$ are large enough. Note that the method of furthest fit does not require an examination of the net-lists. Instead, only a simple estimation of two large capacitance values which are compatible for the library is required.

With either method (i.e., the method of comparison or the method of furthest fit), determining the gradient of the new cell is a simple two-point measurement. Both methods, compared to prior art methods, reduce the amount of time needed to characterize components.

In the current embodiment, the base is carefully pre-characterized and then scaled, thereby saving time and increasing efficiency. The scaling method of the present invention offers an approximation for characterizing subsequent cells. The scaling method of the present invention obtains results that can be confirmed experimentally. Furthermore, the determination of the corner capacitance is in itself an improved method of characterization. Even assuring this benefit, it is interesting to look at the sensitivity to errors generated by the scaling method of the current embodiment.

As previously demonstrated, a curvilinear region and linear region exist on the delay curve of a component. Thus, for prior art methods using a curve-fitting algorithm, high-order polynomials must be found to adequately model, or fit, the delay curve. If the curve is sampled with a finite number of samples, however, a poor fit to the original data is generated. For example, if there is no separation between the curvilinear and linear regions, high-order polynomials are required for an adequate fit, and many of the samples must be used to model the high-order terms. In general, the prior art methods tend to crowd all of the samples near the transition region, which distorts the other parts of the interpolated function—the majority of where the delay for a gate is calculated.

In one embodiment of the present invention, the corner capacitance, $\gamma$, is first determined for a base cell. Only two samples are then needed to characterize the linear region of the base cell; the corner capacitance and another capacitance much greater than the corner capacitance (for example $2\gamma$, $3\gamma$, $4\gamma$, etc.). The remaining samples can then be used to characterize the base cell's curvilinear region. In other words, the current embodiment defines the transition point (i.e., $\gamma$) and separates the curvilinear region and linear region. Thus the interpolation errors are effectively minimized by maximizing the use of the sample points for the curvilinear region.

It is important to note that since the transition between the curvilinear region and the linear region is continuously differentiable, the rate of change of gradient at the corner capacitance approaches zero. Thus, an error in determining the corner capacitance is not critical, since only a small portion of the curve, whose deviation from linear is small, remains as part of the linear approximation.

Once the corner capacitance, $\gamma$, has been determined for the base cell, the scaling method of the current embodiment accurately predicts $\gamma$ for the new cell. Thus, the curvilinear and linear regions on the new cell's delay curve can also be treated separately without having to use a complicated curve-fitting algorithm.

After a best fit for the delay curve has been determined, a number of discrete capacitance sample points (for a fixed edge ramp time) will have been selected. The base cell's corner capacitance and linear region sample points scale directly for the new cell, but the sample points in the curvilinear region require further examination. A simple approximation for the delay curve in the curvilinear is given by the following Taylor expansion:

$$d \cong RC\ln 2 \left[1 - \frac{(1-f)RC\ln 2}{2\tau}\right] \quad (39)$$

By substituting the gradient in the linear region for R, the approximation given in equation 39 becomes:

$$d \cong \frac{\partial d}{\partial C} \frac{C}{f}\left[1 - \frac{1-f}{f}\frac{\partial d}{\partial C}\frac{C}{2\tau}\right] \cong \frac{C}{f}\frac{\partial d}{\partial C} - \frac{1-f}{f^2}\frac{C^2}{2\tau}\left(\frac{\partial d}{\partial C}\right)^2 \quad (40)$$

The approximation given by equation 40 is quadratic in the gradient of the linear region, but becomes almost linear when any of the following conditions occur. $f \to 1$ (i.e., for transistors having a large parasitic resistance), C is small; and $\tau$ is large. These conditions cover most of the situations where the curvilinear region is a significant portion of the delay function. If the approximation is linear, then the delay is directly proportional to the gradient in the linear region, and scaling method of the current embodiment can be extended to include all of the samples for the curve fit. Thus, the step size can be scaled.

As previously noted, because the sample points are directly measured, any error in the sample comes from the extrapolation alone. Thus, even if the quadratic term in the approximation is significant, the overall error is likely to be small. Therefore, the application of the pre-characterization and the scaling method of the current embodiment of the present invention can be justified A best curve fit can be made easily once the corner capacitance is determined. Furthermore, the sample points used for that fit can be directly scaled for each new cell. The current embodiment of the present invention reduces the computational effort for a complete library by quantifying which type of cell characterization steps are used (i.e., linear steps, exponential steps, "golden" steps, etc.), thereby maximizing the effectiveness of each sample point.

Figure 11:
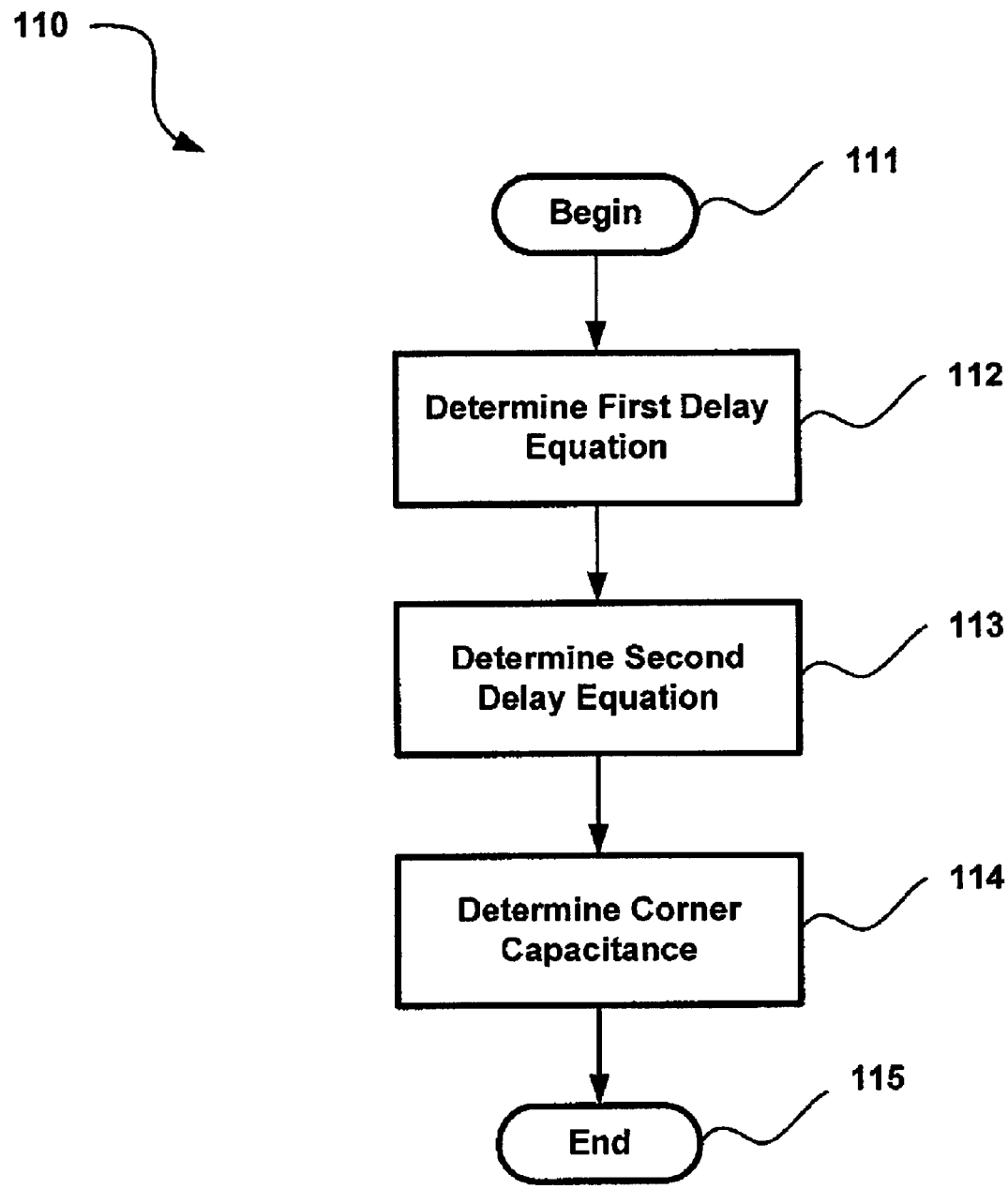
FIG. 11 illustrates an operational process for characterizing the timing delay curve of a component according to one embodiment of the present invention.

FIG. 11 Illustrates the operational process 110 for characterizing the timing delay curve of a component according to one embodiment of the present invention. Operational process 110 is initiated with operation 111. In the current embodiment, operation 111 initiates operational process 110 during the construction of a CAE library. In an alternative embodiment, operation 111 initiates operational process 110 after the CAE library has initially been constructed and a new component is being added to the library, or an existing component is being updated. It should be noted that operation process 111 may be initiated automatically or manually (by a CAE vendor, designer, and user, among others) while remaining within the scope of the present invention.

After operation 111 initiates operational process 110, operation 112 determines a first delay equation for the timing delay curve of a component being characterized. In the current embodiment, the first delay equation represents the curvilinear region of the delay versus capacitance curve of the component that is being characterized. The component being at characterized can be modeled as discussed in conjunction with FIG. 1. The first delay equation is then stored within the system library.

After operation 112 is completed, operation 113 determines a second delay equation for the timing delay curve of a component being characterized. In the current embodiment, the second delay equation represents the linear region of the delay versus capacitance curve of the component being characterized The second delay equation is then stored in the system library.

After operation 113 is completed, operation 114 determines the corner capacitance for the timing delay curve of a component being characterized. In the current embodiment, operation 114 determines the corner capacitance by setting the first delay equation equal to the second delay equation and solving for the capacitance. The corner capacitance represents the transition between the curvilinear and the linear regions of the component's delay curve. The corner capacitance is then stored within the system library.

After the corner capacitance is determined by operation 114, operational process 110 is terminated by operation 115. It should be noted that the order in which the delay equations are determined may be altered while remaining within the scope of the present invention. For example, the delay equation representing the linear region may be determining before determining the delay equation representing the curvilinear region.

Figure 12:
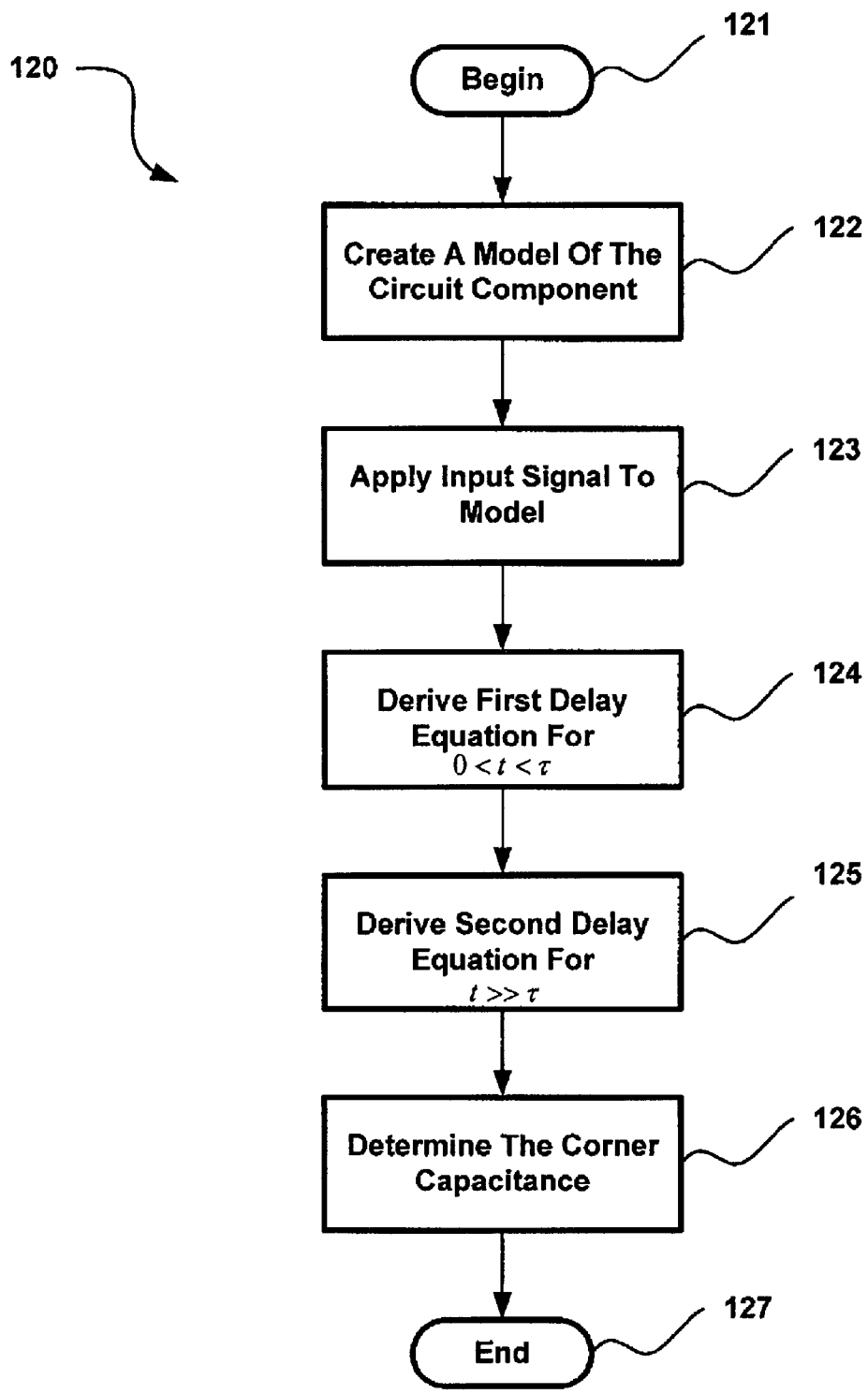
FIG. 12 illustrates an operational process for characterizing the timing delay curve of a component according to an alternative embodiment of the present invention.

FIG. 12 illustrates the operational process 120 for characterizing the timing delay curve of a component according to an alternative embodiment of the present invention. Operational process 120 is initiated with operation 121. In the current embodiment, operation 121 initiates operational process 120 during the construction of a CAE library. In an alternative embodiment, operation 121 initiates operational process 120 after the CAE library has initially been constructed and a new component is being added to the library, or an existing component is being updated. It should be noted that operation process 121 may be initiated automatically or manually (by a CAE vendor, designer, and user, among others) while remaining within the scope of the present invention.

After operation 121 initiates operational process 120, operation 122 creates a model of the component being characterized. In the current embodiment, operation 122 creates a model that contains, among other components, a resistance element and a capacitance element, separated by a switch element. Operation 122 creates a model that is capable of producing a resistance curve (i.e., resistance versus time) and a delay curve (i.e., delay versus load capacitance). It should be noted that operation 122 may create a model containing other components and having a different layout while remaining within the scope of the present invention.

After operation 122 creates the model of the circuit component, operation 123 applies an input signal to the model. In the current embodiment, operation 123 applies the input signal mathematically to the model. Operation 123 applies the input signal to the model while the switch is in an open position. The switch is then closed to allow the input signal to be conducted throughout the model.

After operation 123 applies the input signal to the model, operation 124 derives a first delay equation for the timing delay curve of the component being modeled. In the current embodiment, operation 124 derives the first delay equation from the resistance curve for $0<t<\tau$, where $t=0$ represent the time at which the switch is closed and $\tau$ represents the end of the input edge ramp. It should be noted that first delay equation represents the curvilinear region of the component's corresponding delay curve. The first delay equation is stored in the system library.

After operation 124 derives the first delay equation, operation 125 derives a second delay equation for the timing delay curve of the component being modeled. In the current embodiment, operation 125 derives the second delay equation from the resistance curve for t>>τ. It should be noted that second delay equation represents the linear region of the component's corresponding delay curve. The second delay equation is stored in the system library.

After operation 125 derives the first delay equation, operation 126 determines the corner capacitance for the timing delay curve of the component being modeled. In the current embodiment, operation 126 determines the corner capacitance by setting the first delay equation (as found in operation 124) equal to the second delay equation (as found in operation 125) and solving for the capacitance. The corner capacitance represents the transition between the curvilinear and the linear regions of the component's delay curve. The corner capacitance is then stored within the system library.

After the corner capacitance is determined by operation 126, operational process 120 is terminated by operation 127. It should be noted that the order in which the delay equations are determined may be altered while remaining within the scope of the present invention. For example, the delay equation representing the linear region may be determined before determining the delay equation representing the curvilinear region.

Figure 13:
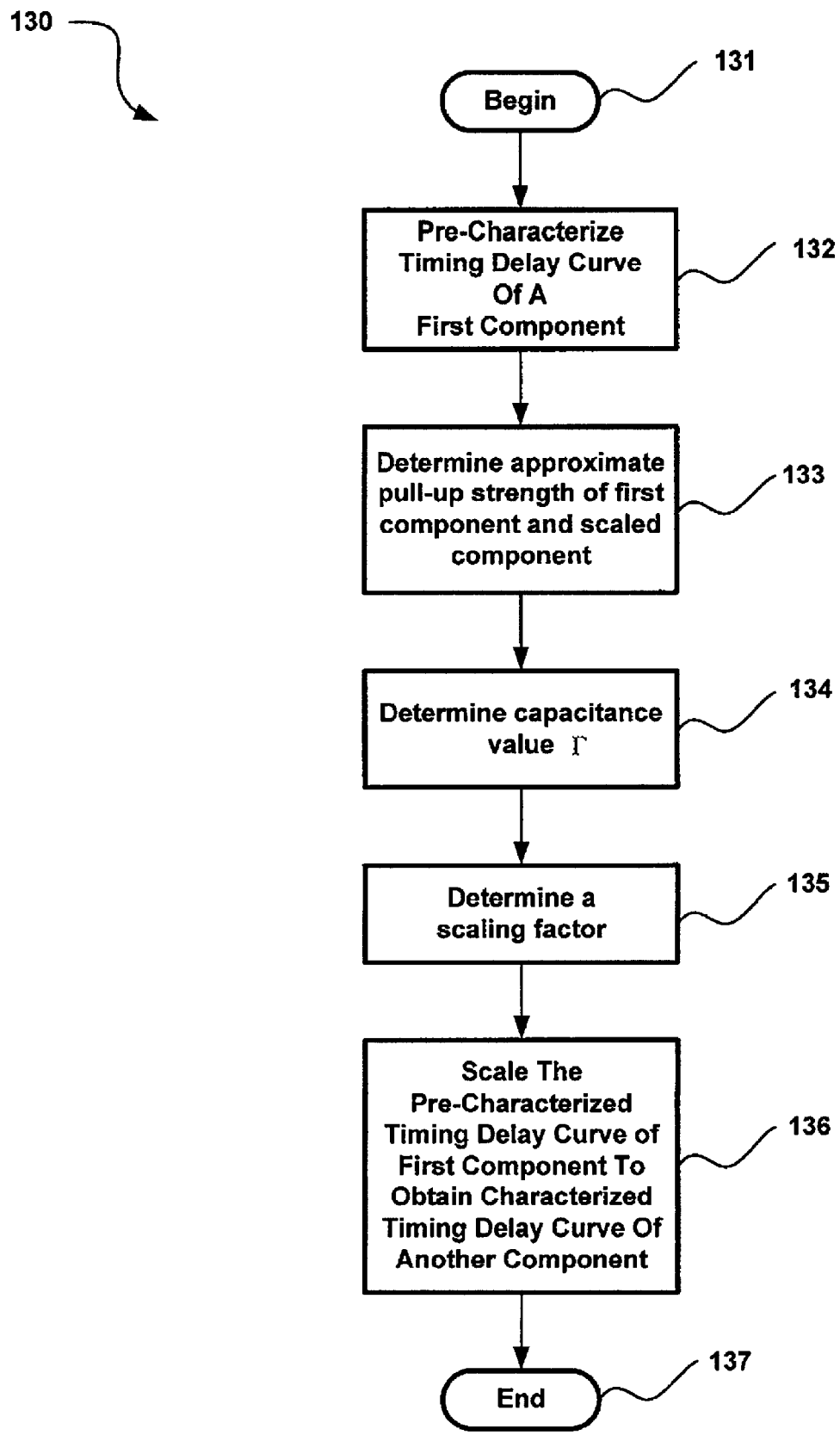
FIG. 13 illustrates an operational process for characterizing the timing delay curve of a component by scaling a pre-characterized component according to an embodiment of the present invention.

FIG. 13 illustrates the operational process 130 for characterizing the tiring delay curve of a component by scaling a pre-characterized component according to an embodiment of the present invention. Operational process 130 is initiated with operation 131. In the current embodiment, operation 131 initiates operational process 130 during the construction of a CAE library. In an alternative embodiment, operation 131 initiates operational process 130 after the CAE library has initially been constructed and a new component is being added to the library, or an existing component is being updated. It should be noted that operation process 131 may be initiated automatically or manually (by a CAE vendor, designer, and user, among others) while remaining within the scope of the present invention.

After operation 131 initiates operational process 130, operation 132 pre-characterizes the timing delay curve of a first component. In the current embodiment, operation 132 pre-characterizes the first component by completing operations 122 through 126 as discussed in conjunction with FIG. 12 Thus, a first delay equation, a second delay equation, and a corner capacitance is determined for the first component. Furthermore, operation 132 determines the gradient of the linear region of the first component's delay curve.

After operation 132 pre-characterizes a first component, operation 133 determines an approximate pull-up strength for the first component and an approximate pull-up strength for the scaled component. In the current embodiment, operation 133 determines an approximate pull-up strength for the first component, $W_{old}$, and calculates an approximate pull-up strength for the scaled component, $W_{new}$, using a transistor net-list provided with the first cell and each new cell. The approximate pull-up strengths of the first component and the scaled component are stored as an equivalent p-transistor width.

After operation 133 determines an approximate pull-up strengths for the first component and the scaled component, operation 134 determines a capacitance value, Γ. In the current embodiment, the capacitance value Γ is the ratio of $W_{old}$ and $W_{new}$, multiplied by the corner capacitance, γ, found in operation 142.

After operation 134 determines the capacitance value, Γ, operation 135 determines a scaling factor. In the current embodiment, operation 135 first determines the gradient of the scaled component by first selecting two capacitance values within the linear region of the scaled component's delay curve (for example, at 2Γ and 3Γ). Operation 135 next finds the two delay points corresponding to the selected capacitance values, finds the difference between the two delay points, and then divides the difference by Γ to obtain the gradient. Operation 135 then determines the scaling factor for the scaled component by determining the ratio of the gradient of the scaled component to the gradient of the first component.

In an alternative embodiment, operation 135 determines the gradient of the linear region of the scaled component by selecting two capacitance values that fall in the linear region for any component within the system library. Operation 135 then finds the delay values corresponding to each capacitance and calculates the gradient as $(d_2-d_1)/(C_2-C_1)$, where $d_2$ and $d_1$ are the delays at $C_2$ and $C_1$, respectively, and $C_2$ and $C_1$ are the selected capacitances.

After operation 135 determines the scaling factor, operation 136 scales the pre-characterized timing delay curve of the first component to obtain the characterized timing delay curve of the scaled component. The pre-characterized information (i.e., delay equations, corner capacitance, gradient, etc.) and the characterized information of the scaled component are stored in the system library.

After operation 136 scales the component, operation 137 terminates operational process 130. It should be noted that an iterative process may be utilized to pre-characterization of the first component while remaining within the scope of the present invention.

Figure 14:
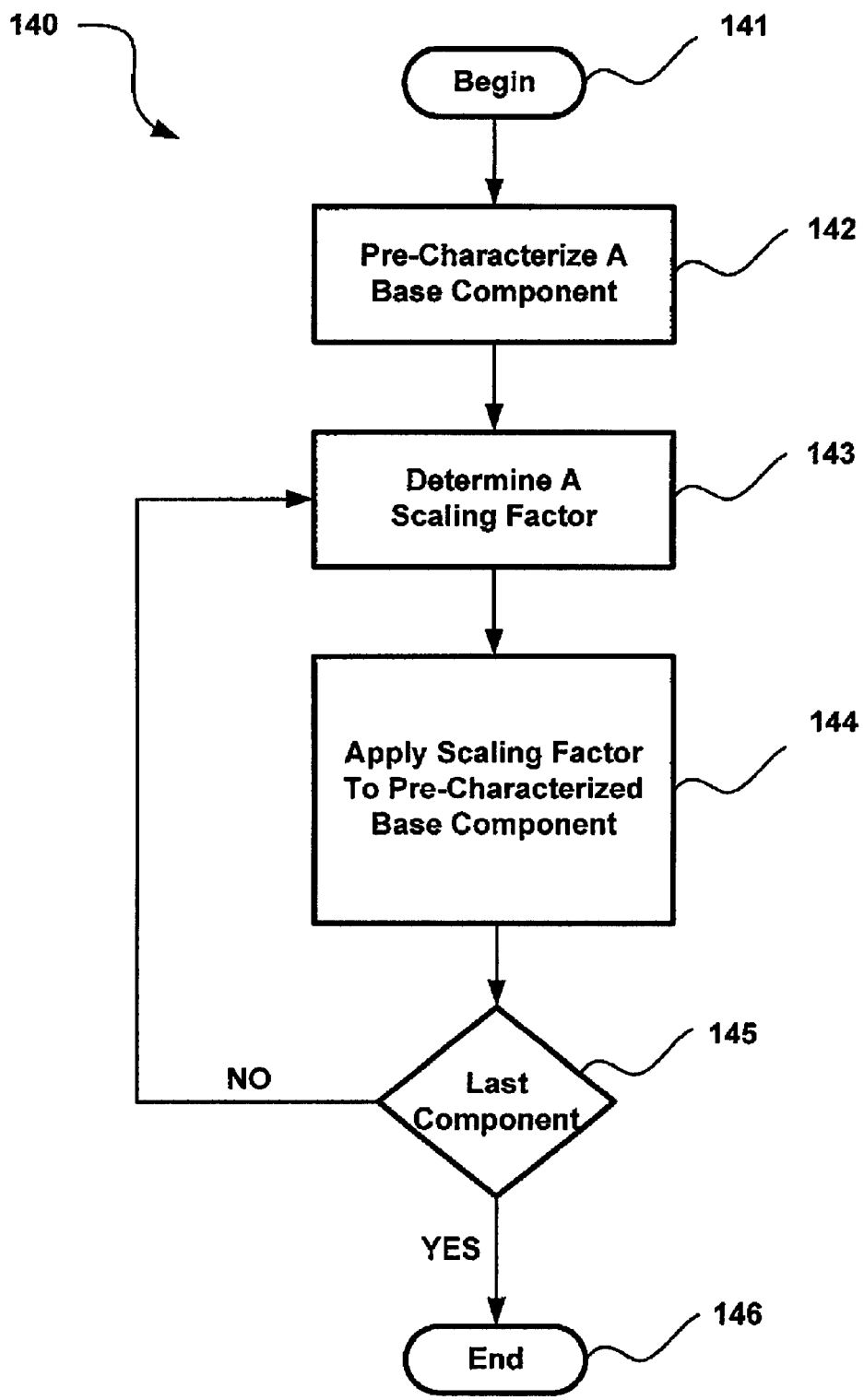
FIG. 14 illustrates an operational process for characterizing the timing delay curve of a plurality of components within a computer aided engineering system according to an embodiment of the present invention.

FIG. 14 illustrates the operational process 140 for characterizing the timing delay curve of a plurality of components within a computer aided engineering system according to an embodiment of the present invention. Operational process 140 is initiated with operation 141. In the current embodiment, operation 141 initiates operational process 140 during the construction of a CAE library. In an alternative embodiment, operation 141 initiates operational process 140 after the CAE library has initially been constructed and a new component is being added to the library, or an existing component is being updated. It should be noted that operation process 141 may be initiated automatically or manually (by a CAE vendor, designer, and user, among others) while remaining within the scope of the present invention.

After operational process 140 is initialized, operation 142 pre-characterizes a base component. In the current embodiment, operation 142 pre-characterizes the base component by determining the delay curve shape (i.e., the shape of the delay curve's curvilinear region and linear region) and the corner capacitance for the base component. Thus, a first delay equation, a second delay equation, and a corner capacitance are determined for the base component. It should be noted that an iterative process may be utilized to pre-characterize the first component while remaining within the scope of the present invention.

After operation 142 pre-characterizes the base component, operation 143 determines a scaling factor for characterizing subsequent components. In one embodiment, operation 143 first determines the gradient of the linear region of the base component's delay curve and the gradient of the linear region of the new component's (i.e., the component to be characterized) delay curve. Next, operation 143 determines the scaling factor as the ratio of the gradient of the new component and the gradient of the base component.

In one embodiment, operation 143 determines the gradient for the new component's delay curve by first determining the approximate pull-up strengths for the base and new components. Next, operation 143 determines a capacitance value, Γ, related to the approximate pull-up strengths of the base and new components; where Γ has a corresponding delay value. Then, operation 143 determines first and second delay values for the new component, where both the first and second delay values are located in a linear region of the delay curve for the new component and where the first and second delay values of the new component have corresponding capacitance values that are greater than Γ. Finally, operation 143 calculates the gradient by determining the delay difference between the first and second delay values and dividing the delay difference by the capacitance value.

In an alternative embodiment, operation 143 determines the gradient of the new component by selecting first and second capacitance values, both of which are larger than the corner capacitance for each of the components within the system library. Next, operation 143 determines a first delay corresponding to the first capacitance value and a second delay corresponding to the second capacitance value. Then, operation 143 calculates the delay difference between the first delay and the second delay and calculates the capacitance difference between the first capacitance and the second capacitance. Finally, operation 143 divides the delay difference by the capacitance difference to determine the gradient.

After operation 143 determines the scaling factor, operation 144 applies the scaling factor to the pre-characterized base component to characterize another new component (i.e., the new component). In the current embodiment, operation 144 saves the pre-characterized formation (i.e., delay equations, corner capacitance, gradient, etc.), the scaling factor, and the characterized information of the new component in the system library.

After operation 144 scales the component, operation 145 determines whether additional components (such as components in the library and components to be added to the library, among others) need to be scaled. If additional components need to be scaled, determination operation 145 branches YES and control is returned to operation 143 so that a scaling factor can be determined for the component. If additional components do not require scaling, determination operation 145 branches NO and control passes to operation 146. Operation 146 terminates operational process 140.

The scaling methods presented in the current embodiment of the present invention allow for the possibility of determining a component's delay table directly, allowing for quick construction of a library. To determine the delay table directly, the resistance values for R and f must first be determined. Once the values for R and f are known, the scaling method predicts the shape of the curve and the position of the corner capacitance. In one embodiment, the resistance values are determined during pre-characterization and scaled. To determine the values of R and f, in the linear region, the following equation can be used:

$$\frac{\partial d}{\partial C} = fR\ln 2 \tag{41}$$

For very small capacitances, the following equation can be used:

$$d \cong R(C + C_I)\ln 2 \Rightarrow \frac{\partial d}{\partial C} = R\ln 2 \tag{42}$$

The gradients may then be measured, although coupling effects that have been ignored may need to be taken into account at very low capacitances.

The parasitic capacitance of a gate may also be needed to allow mixtures of interconnect and gate load to be generated in the correct ratio, or for comparison of components having different architectures. The parasitic capacitance may also be needed if a more direct coupling theory were developed for the low capacitance case In one embodiment, the method insists that the gradient at the corner capacitance be the same for each equation. Thus, the delay equations 41 and 42 can be given by the following, where are α, β, κ, and λ are constants and the β contains the intrinsic capacitance:

$$d = \alpha\left[1 - \frac{1}{\beta 2^{\lambda C}}\right] \Rightarrow \frac{\partial d}{\partial C} = \frac{\alpha\lambda\ln 2}{\beta 2^{\lambda C}} \tag{43}$$

For d=κC, equation 43 becomes:

$$\frac{\partial d}{\partial C} = \kappa \tag{44}$$

By setting equations 43 and 44 equal to each other at the corner capacitance γ, both β and γ can be determined. Furthermore, by noting that $$C_I = \frac{\ln\beta}{\lambda\ln 2},$$

$C_1$ (i.e., the intrinsic capacitance) can be determined. The equation can be solved using iteration, or by expansion using Taylor's series.

Successful ASCI flows also depend on linear functions in their approximations. Nonlinear functions can also be used, but linearity ensures stability where iterative feedback is applied. Guard-bands can be easily developed and applied in a linear system, thereby increasing the amount of control for the estimation process. Unfortunately, the delay functions being estimated are not entirely linear. Thus, non-linearity must be accounted for in an estimation theory.

For the delay calculation, linearity can be equated to a three dimensional plane with the x, y, and z-axis representing edge ramp time, delay, and load, respectively. It is desirable that the plane not be tilted in the edge ramp time dimension, however, such a tilt can be accounted for and compensated.

A plane can be given by the following equation $$d=\alpha C+\beta\tau+\gamma \tag{45}$$

where α, β, and γ are constant and where C is load capacitance and τ is the edge ramp time. Some prior art techniques propose using a surface defined by the following quadratic equation:

$$d=\alpha C+\beta\tau+\gamma+\alpha'C^2+\delta C_\tau \tag{46}$$

where α, α', β, β', γ and δ are constant. As previously shown, however, the scaling method of the present invention illustrated that a quadratic equation does not adequately model either the curvilinear region or the transition point between curvilinear and linear regions. Asymptotic functions are required, and thus, the quadratic equation (i.e., equation 46) used by the prior art techniques will not be addressed by the current embodiment of the present invention.

Figure 15:
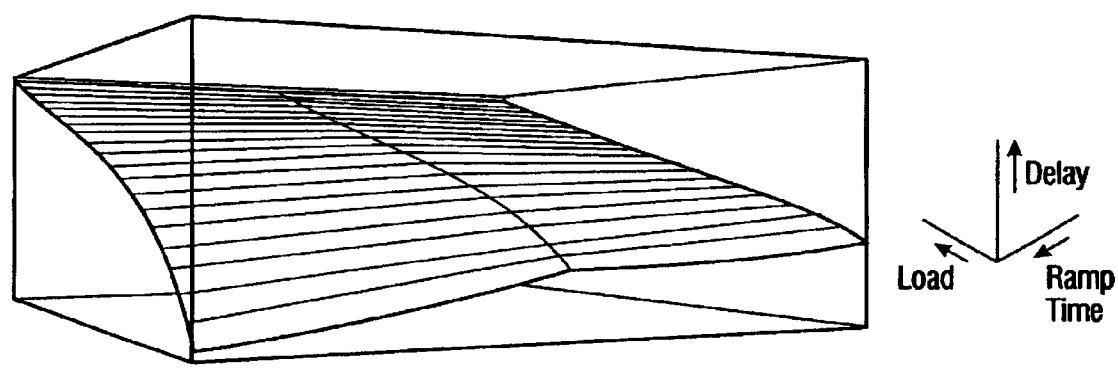
FIG. 15 illustrates an actual measured surface representing delay, load, and ramp time of a component according to an embodiment of the present invention.

Examining a real delay surface obtained by measurement, as shown in FIG. 15, it can be seen that the majority of the surface is planar and that the amount of curvature present is not extreme. The input ramp time in FIG. 15 is shown going from right to left so that the curvature can more easily be seen. The curvature present can be compensated for through clipping.

Figure 16:
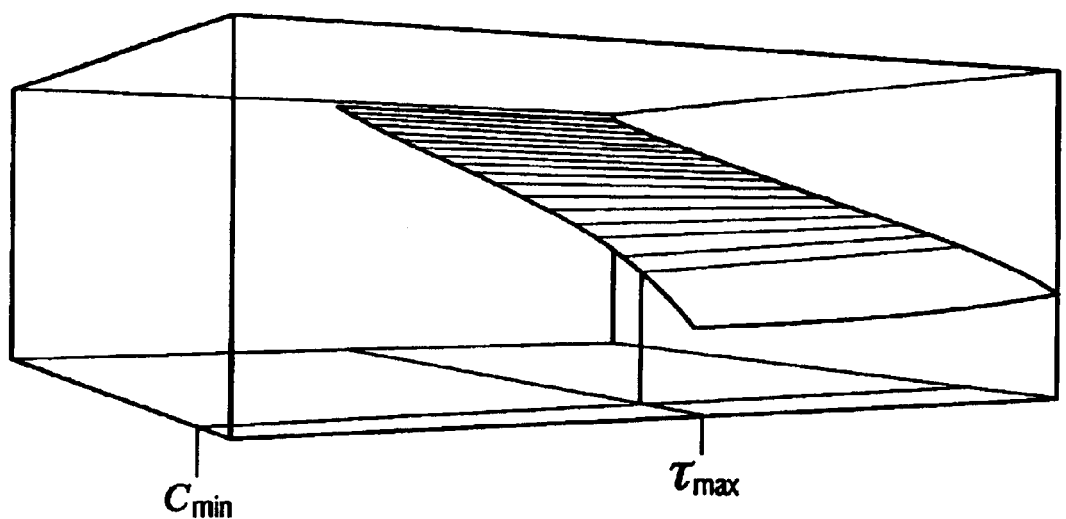
FIG. 16 illustrates a linear portion of the real planar surface of FIG. 15 that has been clipped through the selection of a minimum load capacitance and a maximum input ramp time.

FIG. 16 shows the surface of FIG. 15 after the application of clipping. As illustrated in FIG. 16, if the surface is clipped by two planes given by $d=\alpha C_{min}$ and $d=\beta\tau_{max}$. Using clipping, any deviation from planarity can be minimized. The clipped surface in FIG. 16 is very close to planar, yet still expresses a wide range of load capacitance, and approximately half the previous range of edge ramp times as illustrated in FIG. 15.

In the current embodiment, the clipping planes physically represent a minimum load capacitance that can be approximated as the smallest load represented by any of the cells in a library. The library may be designed to ensure that the minimum cell is the smallest drive inverter Thus, by choosing the critical capacitance $C_{min}$ from a linearity standpoint, the minimum drive strength for the library is effectively selected. The value of the maximum allowed ramp time is generally a published criteria for the library. However the output ramp time can also be given by the equation:

$$\tau_{out} \propto g \frac{C_{out}}{C_{in}} \quad (47)$$

where g is the logical effort for the gate. The minimum output capacitance, $C_{out}$, is just $C_{min}$ for the library, and $C_{in}$ can be easily calculated for a minimum drive gate. Thus, the maximum logical effort can be determined for each gate and compared with the actual logical effort for a particular function. Therefore, using the current embodiment, a determination can be made as to whether the function is viable in the context of the library.

In an alternative embodiment, the function selection criterion is expressed in terms of the pull-up and pull-down strength for a gate. The minimum load can be used to determine the output ramp time. If too slow, then the function is not viable.

Using linearity as a library constraint in an embodiment of the present invention, the minimum drive strength for a library, the maximum allowable edge ramp time for a design using that library, and the viable logical functions for a library can be selected. Each of these features are important design parameters that are traditionally not calculated and not justified. Thus, the linearity criterion on the present invention is an excellent method for determining design parameters for the library.

Figure 17:
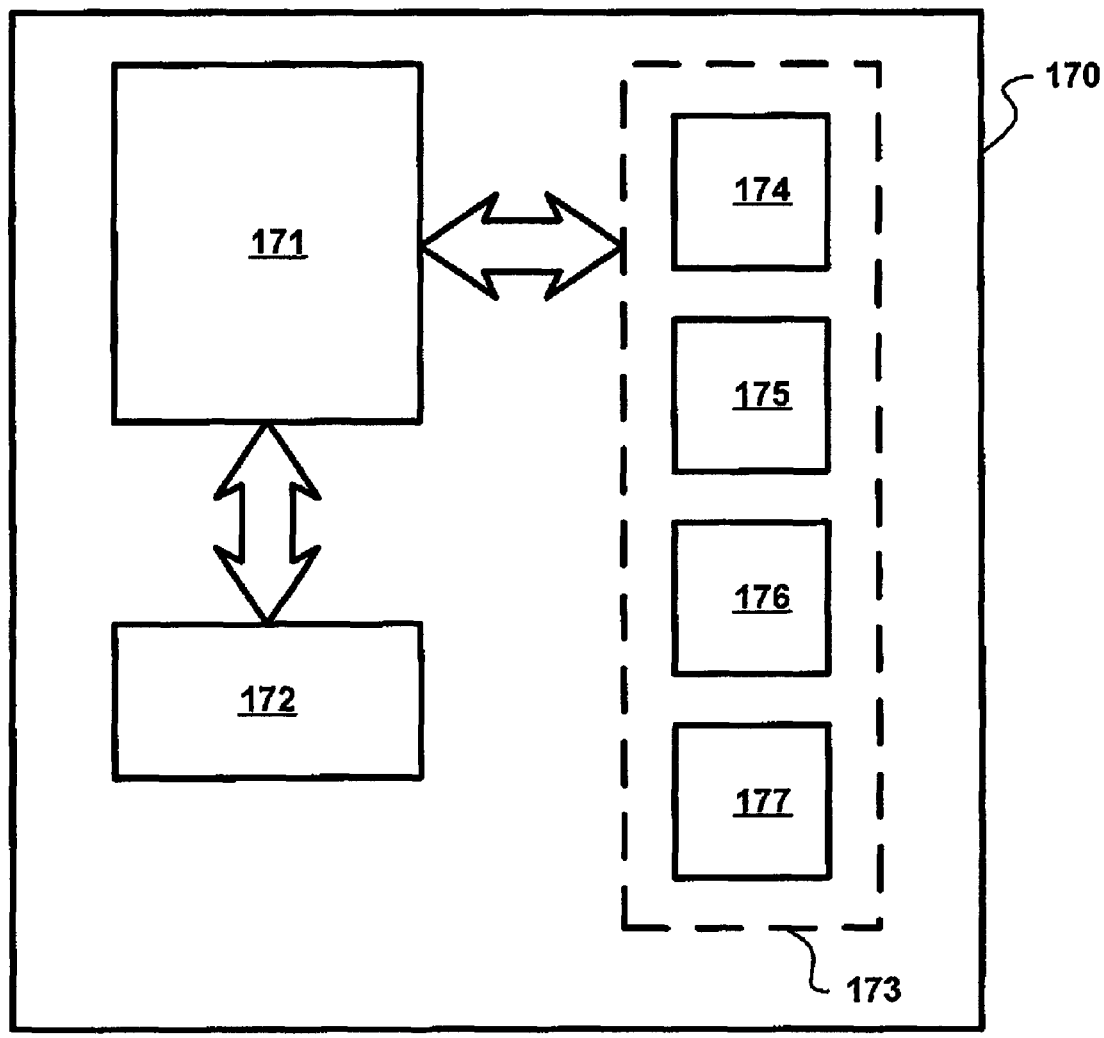
FIG. 17 illustrates one embodiment of a computer system for implementing the present invention as discussed in conjunction with FIGS. 11–14.

FIG. 17 illustrates one embodiment of a computer system 170 for implementing the present invention as discussed in conjunction with FIGS. 11–14. In the current embodiment, the computer system 170 includes a processor 171, memory 172, and a data storage device 173 (for example, a hard drive, ZIP drive, floppy drive, tape drive, etc.). The computer system contains input/output devices (not shown), such as a display, keyboard, printer, modem, and Ethernet card, among others.

In the current embodiment, the data storage device 173 contains an operating system software module 174, a CAE software module 175, a CAE library database 176, and a characterization software module 177, among others. The processor 171 is operable to retrieve information from and store information to the data storage device 173 and the memory 172, implement computational functions, and communicate with the input/output devices, among others.

In the current embodiment, a module refers to an ordered set of instructions (among others), which when executed by a computer system, performs a specific task The CAE software module 175, for example, enables a designer to electronically construct and test a model circuit, without having to physically assemble the model circuit.

The CAE library database 176 contains a list of components that may be selected by the designer for use with the CAE software module 175. The CAE library database 176 may contain a multitude of components and may also contain each component's characteristics or parameter information, among others. In an alternative embodiment, the CAE software database 176 is contained within the CAE software module 175.

The characterization software module 177 enables a designer to characterize library components according to the embodiments of the present invention discussed in conjunction with FIGS. 11–14. For example, the characterization software module 177, allows a user to pre-characterize a first component, determine a scaling factor, and apply the scaling factor to characterize a scaled component. The characterization information of the components can then be stored in the CAE library database 176.

It should be noted that other embodiments of the computer system may be implemented while remaining within the scope of the present invention. For example, the computer system may include a server/slave configuration in which a server containing the operating system software module, the CAE software module, and the CAE library module is remotely accessed by a workstation.

Furthermore, it should be clear to one skilled in the art that the above-described embodiments of the invention are intended to be illustrative only. Numerous alternative embodiments may be devised by those skilled in the art without departing from the scope of the following claims.

What is claimed is:

1. A method for characterizing a timing delay curve for each of a plurality of circuit components, comprising:

pre-characterizing a timing delay curve of a first circuit component; and scaling the pre-characterized timing delay curve of said first circuit component to obtain a timing delay curve of another of said plurality of circuit components, wherein said pre-characterizing includes:

determining a corner capacitance for said first circuit component, said corner capacitance representing a transition point between a first region and a second region of the delay curve of said first circuit component; and determining a gradient of said second region of the delay curve of said first circuit component.

2. The method of claim 1 wherein said determining a corner capacitance further comprises:

solving the equation $$\gamma = \frac{2\tau}{R \ln 2},$$

where $\gamma$ represents the corner capacitance, $\tau$ represents an input signal edge time, and R represents the resistance of said first circuit component.

3. The method of claim 1 wherein said determining a gradient of said second region of the delay curve of said first circuit component further comprises:

determining a first delay located in said second region of the delay curve of said first circuit component;

determining a second delay located in said second region of the delay curve of said first circuit component, said first delay and said second delay being greater than the delay present at said corner capacitance;

determining a delay difference between said first delay and said second delay; and dividing said delay difference by said corner capacitance.

4. The method of claim 1 wherein said scaling step further comprises:

determining an approximate pull-up strength for said first circuit component and an approximate pull-up strength for said another circuit component;

determining a capacitance value τ for said another circuit component, said capacitance value τ being related to the approximate pull-strength of said first circuit component, the approximate pull-up strength of said another circuit component, and the corner capacitance;

determining a first delay of said another circuit component located in said second region of the delay curve of said another circuit component;

determining a second delay of said another circuit component located in said second region of the delay curve of said another circuit component, said first delay and said second delay of the another circuit component being greater than the delay present at said capacitance value τ;

determining a delay difference between said first delay of said another circuit component and said second delay of said another circuit component;

dividing said delay difference by the capacitance value τ.

5. The method of claim 4 wherein determining the capacitance value τ further comprises:

determining $W_{old}$, where $W_{old}$ represents the width of a p-channel transistor having the equivalent pull-up strength of said first circuit component;

determining $W_{new}$ where $W_{new}$ represents the width of a p-channel transistor having the equivalent pull-up strength of the another circuit component; and multiplying the result of $W_{new}$ divided by $W_{old}$ by said corner capacitance.

6. A method for characterizing a plurality of components within a computer aided engineering system library, comprising:

pre-characterizing a base component, wherein said pre-characterizing includes:

determining a corner capacitance for said base component, said corner capacitance representing a transition point between a first region and a second region of a delay curve for said base component; and determining the shape of said first region of said delay curve;

determining the shape of said second region of said delay curve of said base component;

determining a scaling factor; and scaling said pre-characterized base component to character another of said plurality of components.

7. The method of claim 6 wherein said determining the shape of said first region further comprises:

determining a first delay equation for a curvilinear region of said delay curve.

8. The method of claim 6 wherein said determining the shape of said second region further comprises:

determining a second delay equation for a linear region of the delay curve.

9. The method of claim 6 wherein the determining a corner capacitance for said base component further comprises:

determining a first delay equation representing said first region of the delay curve of said base component;

determining a second delay equation representing said second region of the delay curve of said base component, said first delay equation and said second delay equation having a capacitance component;

setting said first delay equation equal to said second delay equation; and solving for said capacitance component.

10. The method of claim 6 wherein the determining a scaling factor step further comprises:

determining a gradient of a second region of a delay curve for the another component;

determining the ratio of said gradient of said second region of said delay curve for said another component and a gradient of said second region of a delay curve for said base component, said gradient of said base component being determining during said pre-characterizing step.

11. The method of claim 10 wherein determining the gradient of said another component further comprises:

determining an approximate pull-up strength for said base component and an approximate pull-up strength for the another component of said plurality of components;

determining a capacitance value τ for said another component, said capacitance value τ being related to the approximate pull-strength of said base component, the approximate pull-up strength of said another component, and the corner capacitance;

determining a first delay value of the another component, said first delay value being located in a second region of the delay curve of the another component;

determining a second delay value of the another component, said second delay value being located in said second region of the delay curve of said another component, said first delay value and said second delay value of the another component being greater than the delay value at said capacitance value τ;

determining a delay difference between said first delay value and said second delay value;

dividing said delay difference by the capacitance value τ.

12. The method of claim 10 wherein determining the gradient of said another component further comprises:

selecting a first capacitance, said first capacitance being larger than a corner capacitance for each of said plurality of components;

determining a first delay at said fist capacitance;

selecting a second capacitance, said second capacitance being larger than a corner capacitance for each of said plurality of components;

determining a second delay at said second capacitance;

calculating a delay difference between said first delay and said second delay;

calculating a capacitance difference said first capacitance and said second capacitance; and dividing said delay difference by said capacitance difference.

13. A computer system for characterizing a component within a computer aided engineering library database, comprising:

a processor, and a data storage device having a characterization software module, said characterization software module carrying an ordered set of instructions, which when executed by said processor, perform a method comprising:

determining a scaling factor that is dependent upon a base component, wherein said determining a scaling factor includes:

characterizing said base component;
determining a gradient of said base component's delay curve;
determining a gradient of said component's delay curve; and
determining a ratio of said gradient of said component's delay curve to said gradient of said base component's delay curve; and
applying said scaling factor to characterize said component.

14. The computer system of claim 13 wherein characterizing a base component further comprises determining at least one of a first delay equation, a second delay equation, and a corner capacitance.

15. The computer system of claim 13 wherein said method further comprises storing said characterized component information within said computer aided engineering library database.

16. The computer system of claim 13 wherein said data storage device has at least one of an operating system software module, and a computer aided engineering software module.

17. The computer system of claim 13 further comprising at least one of a memory, an input device, and an output device.

* * * * *

UNITED STATES PATENT AND TRADEMARK OFFICE
CERTIFICATE OF CORRECTION

PATENT NO. : 6,813,753 B2
DATED : November 2, 2004
INVENTOR(S) : Anthony Mark Jones It is certified that error appears in the above-identified patent and that said Letters Patent is hereby corrected as shown below:

Title page,
Item [57], ABSTRACT,
Line 2, delete "current" and insert therefore -- circuit --.
Line 3, after "first" insert -- , --.
Line 4, after "linear" insert -- region. The --.

Column 1,
Line 41, after "others" insert -- . --.
Line 54, delete "m" and insert therefore -- in --.
Line 59, after "exist" insert -- , --.

Column 2,
Line 59, after "invention" insert -- . --.

Column 3,
Line 20, delete "The".
Line 52, delete "pre-characterize" and insert therefore -- pre-characterizing --.

Column 4,
Line 3, delete "etc" and insert therefore -- etc.) --.
Line 4, before "according" delete -- ) --.
Line 13, after "ignored" insert -- . --.
Line 55, delete "0<t<$\tau$." and insert therefore -- $0 \leqq t \leqq \tau$. --.

Column 5,
Line 27, delete "0<t<$\tau$." and insert therefore -- $0 \leqq t \leqq \tau$. --.
equation (8), delete "$\tau(t)$" and insert therefore -- $i(t)$ --.

Column 7,
Lines 38 and 39, delete "predominantly" and insert therefore -- predominately --.
Line 39, after "inactive" insert -- . --.
Lines 45 and 46, delete "predominantly", two occurrences, and insert therefore
-- predominately --.
Line 50, delete "mud-rail" and insert therefore -- mid-rail --.
Line 63, after "capacitance)" insert -- . --.

UNITED STATES PATENT AND TRADEMARK OFFICE
CERTIFICATE OF CORRECTION

PATENT NO. : 6,813,753 B2
DATED : November 2, 2004
INVENTOR(S) : Anthony Mark Jones It is certified that error appears in the above-identified patent and that said Letters Patent is hereby corrected as shown below:

Column 8,
Line 1, delete "sample" and insert therefore -- simple --.
Line 3, delete "$C_1$." and insert therefore -- $C_I$, --.
Line 4, delete "$C_1$" two occurrences, and insert therefore -- $C_I$ --.
equations (20) and 21, delete "$C_1$" and insert therefore -- $C_I$ --.

Column 9,
Line 39, delete "unscaled" and insert therefore -- un-scaled --.

Column 10,
Line 27, after "process" insert -- . --.
Line 65, delete "the".

Column 11,
Line 65, after "$C_2$" insert -- , --.

Column 12,
Line 24, delete "assuring" and insert therefore -- assuming --.

Column 13,
Line 20, delete "occur." and insert therefore -- occur: --.
Line 21, delete "resistance)," and insert therefore -- resistance); --.
Line 63, delete "at".

Column 14,
Line 4, after "characterized" insert -- . --.
Line 20, delete "determining" and insert therefore -- determined --.

Column 15,
Line 26, delete "tiring" and insert therefore -- timing --.
Line 44, after "12" insert -- . --.

Column 17,
Line 30, delete "formation" and insert therefore -- information --.
Line 30, delete "(i.e ," and insert therefore -- (i.e., --.

Column 18,
Line 6, after "case" insert -- . --.
Line 30, delete "$C_1$" and insert therefore -- $C_I$ --.

UNITED STATES PATENT AND TRADEMARK OFFICE
CERTIFICATE OF CORRECTION

PATENT NO. : 6,813,753 B2
DATED : November 2, 2004
INVENTOR(S) : Anthony Mark Jones It is certified that error appears in the above-identified patent and that said Letters Patent is hereby corrected as shown below:

Column 19,
Line 16, after "inverter" insert -- . --.
Line 55, delete "modern," and insert therefore -- modem, --.

Column 21,
Lines 9, 10, 22 and 26, delete "$\tau$", each occurrence, and insert therefore -- $\Gamma$ --.
Line 28, delete "$\tau$" and insert therefore -- $\Gamma$ --.
Line 32, after "$W_{new}$", first occurrence, insert -- , --.
Lines 52 and 53, delete "character" and insert therefore -- characterize --.

Column 22,
Line 16, delete "determining" and insert therefore -- determined --.
Lines 23, 24, 36 and 39, delete "$\tau$", each occurrence, and insert therefore -- $\Gamma$ --.
Line 45, delete "fist" and insert therefore -- first --.
Line 52, after "difference" insert -- between --.
Line 59, after "processor" delete "," and insert therefore -- ; --.

Signed and Sealed this

Third Day of May, 2005

JON W. DUDAS
*Director of the United States Patent and Trademark Office*